United States Patent
Edwards et al.

(10) Patent No.: US 10,497,787 B2
(45) Date of Patent: Dec. 3, 2019

(54) DRIFT REGION IMPLANT SELF-ALIGNED TO FIELD RELIEF OXIDE WITH SIDEWALL DIELECTRIC

(71) Applicant: Texas Instruments Incorporated, Dallas, TX (US)

(72) Inventors: Henry Litzmann Edwards, Garland, TX (US); Binghua Hu, Plano, TX (US); James Robert Todd, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/406,891

(22) Filed: Jan. 16, 2017

(65) Prior Publication Data

US 2017/0213893 A1    Jul. 27, 2017

Related U.S. Application Data

(63) Continuation of application No. 15/003,776, filed on Jan. 21, 2016, now Pat. No. 9,583,612.

(51) Int. Cl.
*H01L 29/40* (2006.01)
*H01L 29/78* (2006.01)
(Continued)

(52) U.S. Cl.
CPC ...... *H01L 29/408* (2013.01); *H01L 21/02238* (2013.01); *H01L 21/02255* (2013.01);
(Continued)

(58) Field of Classification Search
CPC ............... H01L 29/402; H01L 29/1095; H01L 29/42368; H01L 29/66681; H01L 29/7816
See application file for complete search history.

(56) References Cited

U.S. PATENT DOCUMENTS

| 4,795,716 A | 1/1989 | Yilmaz et al. |
| 4,990,982 A | 2/1991 | Omoto et al. |

(Continued)

FOREIGN PATENT DOCUMENTS

| JP | H0955502 A | 2/1997 |
| JP | HO9 55502 A | 2/1997 |
| JP | 2011204998 A | 10/2011 |

OTHER PUBLICATIONS

Notification of Transmittal of the International Search Report and the Written Opinion of the Searching Authority, or the Declaration dated Apr. 27, 2017.

(Continued)

*Primary Examiner* — Feifei Yeung Lopez
(74) *Attorney, Agent, or Firm* — Andrew R. Ralston; Charles A. Brill; Frank D. Cimino

(57) ABSTRACT

An integrated circuit which includes a field-plated FET is formed by forming a first opening in a layer of oxide mask, exposing an area for a drift region. Dopants are implanted into the substrate under the first opening. Subsequently, dielectric sidewalls are formed along a lateral boundary of the first opening. A field relief oxide is formed by thermal oxidation in the area of the first opening exposed by the dielectric sidewalls. The implanted dopants are diffused into the substrate to form the drift region, extending laterally past the layer of field relief oxide. The dielectric sidewalls and layer of oxide mask are removed after the layer of field relief oxide is formed. A gate is formed over a body of the field-plated FET and over the adjacent drift region. A field plate is formed immediately over the field relief oxide adjacent to the gate.

20 Claims, 16 Drawing Sheets

(51) Int. Cl.

| | | |
|---|---|---|
| *H01L 21/02* | (2006.01) | |
| *H01L 21/266* | (2006.01) | |
| *H01L 27/06* | (2006.01) | |
| *H01L 29/10* | (2006.01) | |
| *H01L 29/423* | (2006.01) | |
| *H01L 21/265* | (2006.01) | |
| *H01L 21/324* | (2006.01) | |
| *H01L 21/762* | (2006.01) | |
| *H01L 29/06* | (2006.01) | |
| *H01L 29/167* | (2006.01) | |
| *H01L 21/8234* | (2006.01) | |
| *H01L 21/32* | (2006.01) | |
| *H01L 29/66* | (2006.01) | |
| *H01L 27/088* | (2006.01) | |
| *H01L 29/08* | (2006.01) | |
| *H01L 21/225* | (2006.01) | |

(52) U.S. Cl.
CPC ........ *H01L 21/2253* (2013.01); *H01L 21/266* (2013.01); *H01L 21/26513* (2013.01); *H01L 21/32* (2013.01); *H01L 21/324* (2013.01); *H01L 21/76202* (2013.01); *H01L 21/76224* (2013.01); *H01L 21/823418* (2013.01); *H01L 21/823462* (2013.01); *H01L 27/0617* (2013.01); *H01L 27/088* (2013.01); *H01L 29/0653* (2013.01); *H01L 29/0847* (2013.01); *H01L 29/1095* (2013.01); *H01L 29/167* (2013.01); *H01L 29/402* (2013.01); *H01L 29/42368* (2013.01); *H01L 29/66659* (2013.01); *H01L 29/66681* (2013.01); *H01L 29/7816* (2013.01); *H01L 29/7823* (2013.01); *H01L 29/7835* (2013.01); *H01L 29/063* (2013.01); *H01L 29/1083* (2013.01)

(56) References Cited

U.S. PATENT DOCUMENTS

| | | | |
|---|---|---|---|
| 5,428,241 A | 6/1995 | Terashima | |
| 5,517,046 A * | 5/1996 | Hsing | H01L 23/4824 |
| | | | 257/336 |
| 5,622,878 A | 4/1997 | Beasom | |
| 6,255,154 B1 * | 7/2001 | Akaishi | H01L 21/266 |
| | | | 257/E21.346 |
| 6,392,274 B1 * | 5/2002 | Tung | H01L 29/0623 |
| | | | 257/339 |
| 6,483,149 B1 | 11/2002 | Mosher et al. | |
| 2002/0048912 A1 * | 4/2002 | Kikuchi | H01L 29/0847 |
| | | | 438/514 |
| 2005/0199968 A1 * | 9/2005 | Matsui | H01L 21/84 |
| | | | 257/412 |
| 2008/0315308 A1 * | 12/2008 | Huang | H01L 29/0847 |
| | | | 257/343 |
| 2009/0023046 A1 | 9/2009 | Cai | |
| 2010/0102386 A1 | 4/2010 | You | |
| 2010/0102388 A1 * | 4/2010 | Levin | H01L 21/823418 |
| | | | 257/343 |
| 2010/0301411 A1 * | 12/2010 | Takeda | H01L 29/0696 |
| | | | 257/335 |
| 2011/0241114 A1 * | 10/2011 | Su | H01L 29/0634 |
| | | | 257/343 |
| 2012/0037988 A1 * | 2/2012 | Hao | H01L 29/0634 |
| | | | 257/343 |
| 2013/0037883 A1 * | 2/2013 | Huang | H01L 21/8249 |
| | | | 257/336 |
| 2013/0087828 A1 | 4/2013 | Koshimizu et al. | |
| 2014/0021560 A1 | 1/2014 | Su et al. | |
| 2014/0048880 A1 | 2/2014 | Tsuchiko | |
| 2014/0264581 A1 * | 9/2014 | Chan | H01L 29/42368 |
| | | | 257/339 |
| 2015/0085408 A1 | 3/2015 | Ellis-Monaghan et al. | |
| 2015/0137192 A1 | 5/2015 | Han | |
| 2015/0295081 A1 * | 10/2015 | Matsuda | H01L 29/7816 |
| | | | 257/339 |
| 2016/0190269 A1 | 6/2016 | Brown et al. | |
| 2016/0254346 A1 * | 9/2016 | Zhang | H01L 29/063 |
| | | | 257/339 |

OTHER PUBLICATIONS

EU Search Report for Application No. 17742111.2-1212/3430647, Patent No. PCT/US2017014581, dated Mar. 22, 2019.

EU Search Report for Application No. 17742111.2-1212/3430647, dated Aug. 9, 2019.

Chahar Suman, et al: "The impact of gate and channel length of a Si LDMOS transistor on its on resistance and breakdown voltage", 2015 International Conference on Electrical, Electronics, Signals, Communication and Optimization (EESCO), IEEE, Jan. 24, 2015, pp. 1-4, XP033200347, DOI: 10.1109/EESCO.2015.253874 ISBN: 978-1-4799-7676-8.

* cited by examiner

DRIFT REGION IMPLANT SELF-ALIGNED TO FIELD RELIEF OXIDE WITH SIDEWALL DIELECTRIC

CROSS-REFERENCE TO RELATED APPLICATIONS

Under 35 U.S.C. § 120, this continuation application claims benefits of and priority to U.S. patent application Ser. No. 15/003,776 (TI-75887), filed on Jan. 21, 2016, the entirety of which are hereby incorporated herein by reference.

FIELD

This disclosure relates to the field of integrated circuits. More particularly, this disclosure relates to field effect transistors in integrated circuits.

BACKGROUND

Some integrated circuits contain field effect transistors (FETs) with drift regions to enable higher voltage operation. As these integrated circuits are scaled to the next generation of products, there is a desire to increase the switching frequency of these FETs to reduce the sizes of the external passive components such as inductors while maintaining a low power dissipation in these FETs. This requires simultaneously reducing the switching parasitics and the on-state specific resistances (the area-normalized on-state resistances) of the FETs.

To enable operation at elevated drain voltage, the FETs employ drift regions that deplete under high drain voltage conditions, allowing the FETs to block the voltage while supporting conduction during the on-state. A higher voltage FET tends to be formed with the gate extending over field oxide in order to act as a field plate for the drift region. Unfortunately, field oxide in advanced fabrication nodes such as the 250 nanometer node and beyond is commonly formed by shallow trench isolation (STI) processes, and is generally too thick for optimal use as a field relief oxide under a gate extension field plate in such a FET.

SUMMARY

The following presents a simplified summary in order to provide a basic understanding of one or more aspects of the disclosure. This summary is not an extensive overview of the disclosure, and is neither intended to identify key or critical elements of the disclosure, nor to delineate the scope thereof. Rather, the primary purpose of the summary is to present some concepts of the disclosure in a simplified form as a prelude to a more detailed description that is presented later.

An integrated circuit which includes a field-plated FET is formed by forming a layer of oxide mask over a top surface of a substrate of the integrated circuit, covering an area for the field-plated FET. A first opening is formed in the layer of oxide mask, exposing an area for a drift region of the field-plated FET. Dopants are implanted into the substrate under the first opening. Subsequently, dielectric sidewalls are formed on the layer of oxide mask along a lateral boundary of the first opening. A layer of field relief oxide is formed at the top surface of the substrate in the area of the first opening which is exposed by the dielectric sidewalls. The implanted dopants are diffused into the substrate to form the drift region, extending laterally past the layer of field relief oxide. The dielectric sidewalls and layer of oxide mask are removed after the layer of field relief oxide is formed. A gate of the field-plated FET is formed over a body of the field-plated FET, extending over the adjacent drift region. A field plate is formed immediately over the field relief oxide adjacent to the gate.

DETAILED DESCRIPTION

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. One skilled in the relevant art, however, will readily recognize that the disclosure can be practiced without one or more of the specific details or with other methods. In other instances, well-known structures or operations are not shown in detail to avoid obscuring the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

Figure 1:
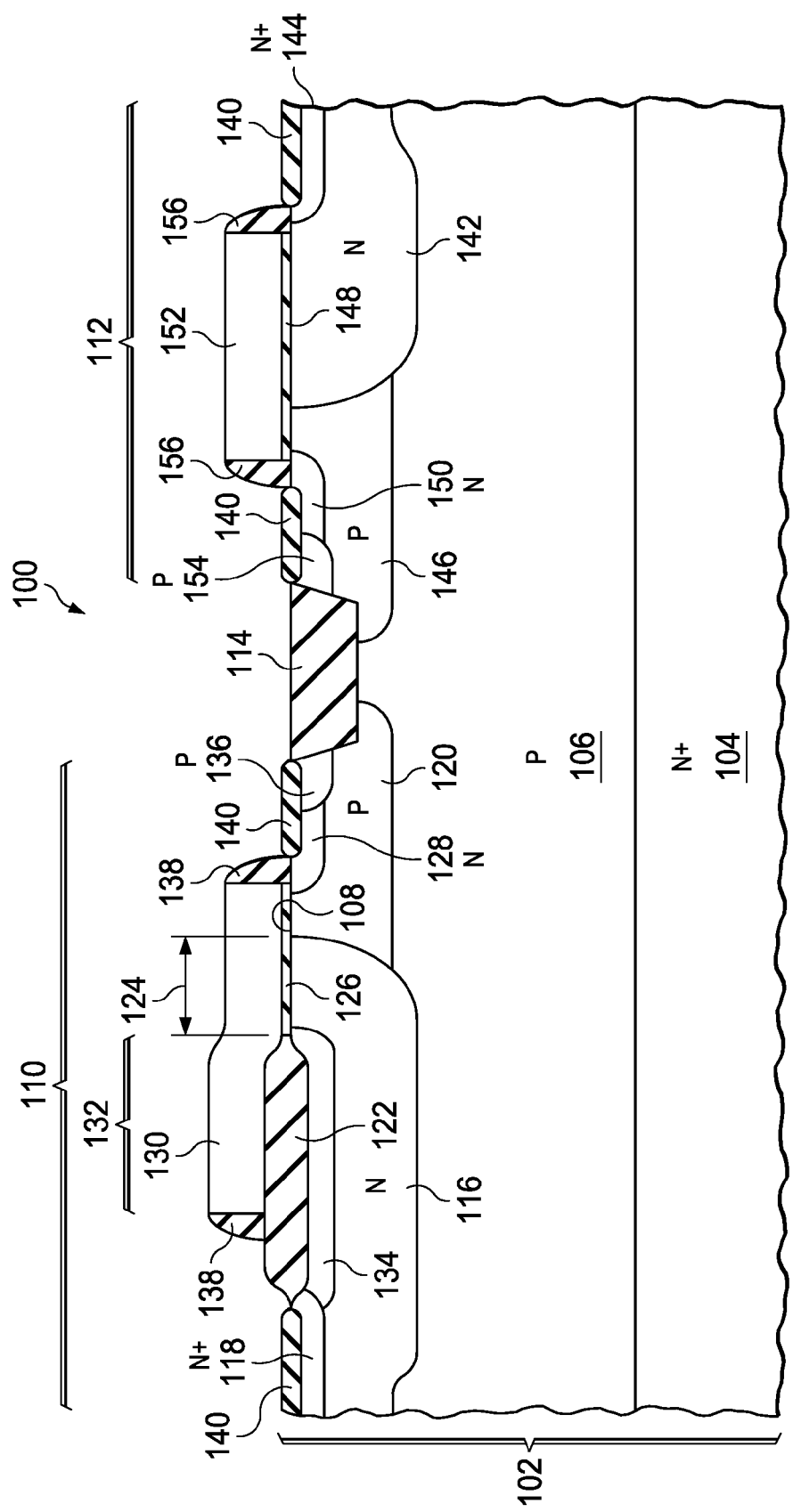
FIG. 1 is a cross section of an example integrated circuit including a field-plated FET.

FIG. 1 is a cross section of an example integrated circuit including a field-plated FET. In the instant example, an n-channel field-plated FET will be disclosed. An analogous p-channel field-plated FET may be described with appropriate changes in polarities of dopants. The integrated circuit 100 includes a substrate 102, possibly with a heavily doped n-type buried layer 104 and a p-type layer 106 over the n-type buried layer 104. The p-type layer 106 extends to a top surface 108 of the substrate 102. The integrated circuit 100 includes the n-channel field-plated FET 110. The integrated circuit 100 may also optionally include a planar FET 112. Components of the integrated circuit 100, such as the field-plated FET 110 and the planar FET 112 may be laterally separated by field oxide 114. The field oxide 114 may have an STI structure as depicted in FIG. 1, or may have a localized oxidation of silicon (LOCOS) structure.

The field-plated FET 110 includes an n-type drift region 116 disposed in the substrate 102. The drift region 116 extends from an n-type drain contact region 118 to a p-type body 120 of the field-plated FET 110. An average dopant density of the drift region 116 may be, for example, $1 \times 10^{16}$ $cm^{-3}$ to $1 \times 10^{16}$ $cm^{-3}$. The drift region 116 may have a heavier-doped top portion and a lighter doped bottom portion, to provide desired values of breakdown voltage and specific resistance for the field-plated FET 110. A layer of field relief oxide 122 is disposed over the drift region 116. The field relief oxide 122 has a tapered profile at lateral edges of the field relief oxide 122, commonly referred to as a bird's beak. The field relief oxide 122 is thinner than the field oxide 114. The drift region 116 extends past the field relief oxide 122 by a lateral distance 124 adjacent to the body 120. The lateral distance 124 may be, for example, 100 nanometers to 200 nanometers, which may advantageously provide desired low values of specific resistance and gate-drain capacitance of the field-plated FET 110. A gate dielectric layer 126 of the field-plated FET 110 is disposed at the top surface 108 of the substrate 102, extending from the field relief oxide 122 to an n-type source 128 of the field-plated FET 110 abutting the body 120 opposite from the drift region 116. The gate dielectric layer 126 is disposed over a portion of the drift region 116 which extends past the field relief oxide 122, and over a portion of the body 120 between the drift region 116 and the source 128. The field relief oxide 122 is at least twice as thick as the gate dielectric layer 126. The field-plated FET 110 includes a gate 130 disposed over the gate dielectric layer 126, extending from the source 128, over the portion of the body 120 between the drift region 116 and the source 128, and over the portion of the drift region 116 which extends past the field relief oxide 122. In the instant example, the gate 130 extends partway over the field relief oxide 122 to provide a field plate 132 over a portion of the drift region 116. In an alternate version of the instant example, the field plate may be provided by a separate structural element from the gate 130. The thickness of the field relief oxide 122 may be selected to provide a desired maximum value of electric field in the drift region 116 during operation of the field-plated FET 110.

The field-plated FET 110 may possibly include an optional charge adjustment region 134 disposed in the substrate immediately under the field relief oxide 122. The charge adjustment region 134 is substantially aligned with the field relief oxide 122. In one version of the instant example, dopants in the charge adjustment region 134 may be n-type, such as phosphorus and/or arsenic, so that a net dopant density in the charge adjustment region 134 is higher than in the drift region 116 below the charge adjustment region 134. In this version of the instant example, the charge adjustment region 134 may be considered to be a part of the drift region 116. In another version of the instant example, dopants in the charge adjustment region 134 may be p-type, such as boron, gallium and/or indium, which compensate, but do not counterdope, the n-type dopants of the drift region 116, so that a net dopant density in the charge adjustment region 134 is lower than in the drift region 116 below the charge adjustment region 134, but remains n-type. In this version of the instant example, the charge adjustment region 134 may also be considered to be a part of the drift region 116. In a further version of the instant example, the dopants in the charge adjustment region 134 may be p-type, which counterdope the n-type dopants of the drift region 116, so that a net dopant density in the charge adjustment region 134 is converted to p-type. In this version of the instant example, the charge adjustment region 134 may be considered to be separate from the drift region 116. Dopant polarity and density in the charge adjustment region 134 may be selected to provide desired values of breakdown voltage and specific resistance for the field-plated FET 110.

The field-plated FET 110 may also include a p-type body contact region 136 disposed in the substrate 102 in the body 120. Gate sidewall spacers 138 may be disposed on side surfaces of the gate 130. Metal silicide 140 may be disposed on the drain contact region 118 and the source 128 and body contact region 136. The field-plated FET 110 may have a drain-centered configuration in which the drain contact region 118 is surrounded by the field relief oxide 122, which is surrounded by the body 120 and source 128. Other configurations of the field-plated FET 110 are within the scope of the instant example.

The planar FET 112 includes an n-type drift region 142 disposed in the substrate 102. The drift region 142 extends from an n-type drain contact region 144 to a p-type body 146 of the planar FET 112. The planar FET 112 is free of a layer of field relief oxide similar to the field relief oxide 122 of the field-plated FET 110. The planar FET 112 is also free of charge adjustment regions similar to the charge adjustment region 134 of the field-plated FET 110. The drift region 142 of the planar FET 112 has a similar distribution and species of dopants as the drift region 116 of the field-plated FET 110, as a result of being formed concurrently.

A gate dielectric layer 148 of the planar FET 112 is disposed at the top surface 108 of the substrate 102, extending from the drain contact region 144 to an n-type source 150 of the planar FET 112 abutting the body 146 opposite from the drift region 142. The gate dielectric layer 148 is disposed over a portion of the drift region 142 between the drain contact region 144 and the body 146, and over a portion of the body 146 between the drift region 142 and the source 150. The planar FET 112 includes a gate 152 disposed over the gate dielectric layer 148, extending from the source 150 to a position proximate to the drain contact region 144.

The planar FET 112 may also include a p-type body contact region 154 disposed in the substrate 102 in the body 146. Gate sidewall spacers 156 may be disposed on side surfaces of the gate 152. The metal silicide 140, if present on the field-plated FET 110 may be disposed on the drain contact region 144 and the source 150 and body contact region 154. The planar FET 112 may have a drain-centered configuration or other configuration.

Figure 2A:
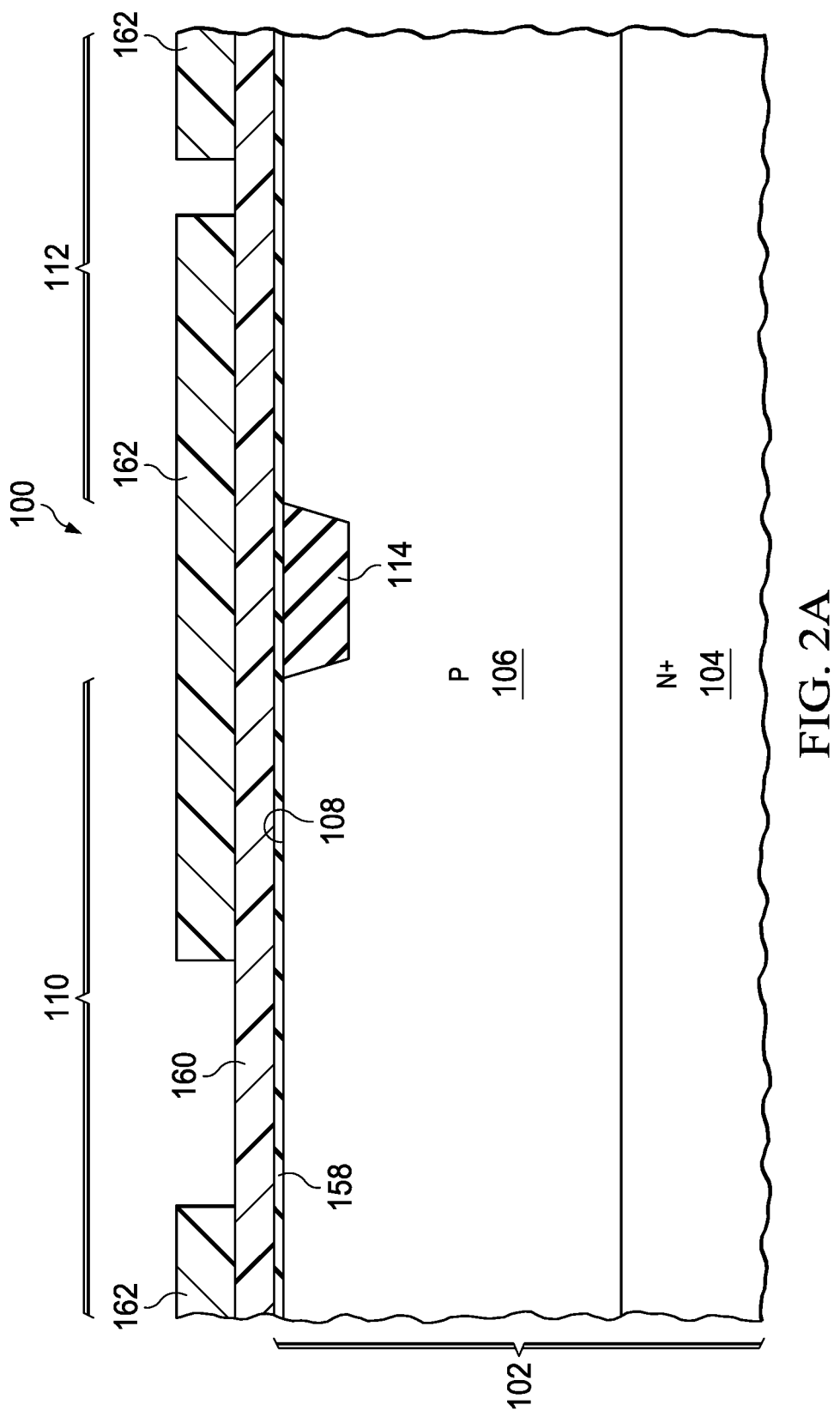
FIG. 2A through FIG. 2K are cross sections of the integrated circuit of FIG. 1, depicting successive stages of an example method of formation.

FIG. 2A through FIG. 2K are cross sections of the integrated circuit of FIG. 1, depicting successive stages of an example method of formation. Referring to FIG. 2A, the substrate 102 may be formed by starting with a p-type silicon wafer, possibly with an epitaxial layer on a top surface, and forming the n-type buried layer 104 by implanting n-type dopants such as antimony at a dose of $1\times10^{15}$ $cm^{-2}$ to $1\times10^{16}$ $cm^{-2}$. A thermal drive process heats the wafer to activate and diffuse the implanted n-type dopants. The p-type layer 106 is formed on the wafer by an epitaxial process with in-situ p-type doping. The epitaxially formed material may be, for example 4 microns to 6 microns thick, advantageously enabled by the relatively shallow drift region 116 of FIG. 1, which is made possible by the self-aligned nature of the field relief oxide 122 of FIG. 1 relative to the drift region 116. The n-type dopants diffuse partway into the epitaxially grown material, so that the n-type buried layer 104 overlaps a boundary between the original silicon wafer and the epitaxially grown material. An average bulk resistivity of the p-type layer 106 may be, for example, 1 ohm-cm to 10 ohm-cm. An optional p-type buried layer may be formed in the p-type layer 106 by implanting boron at an energy, for example, of 2 mega-electron volts (MeV) to 3 MeV.

The field oxide 114 is formed at the top surface 108 of the substrate 102, for example by an STI process or a LOCOS process. An example STI process includes forming a chemical mechanical polish (CMP) stop layer of silicon nitride and a layer of STI pad oxide over the substrate 102. Isolation trenches are etched through the CMP stop layer and the STI pad oxide and into the substrate 102. The isolation trenches are filled with silicon dioxide using a plasma enhanced chemical vapor deposition (PECVD) process using tetraethyl orthosilicate (TEOS), a high density plasma (HDP) process, a high aspect ratio process (HARP) using TEOS and ozone, an atmospheric chemical vapor deposition (AP-CVD) process using silane, or a sub-atmospheric chemical vapor deposition (SACVD) process using dichlorosilane. Excess silicon dioxide is removed from over the CMP stop layer by an oxide CMP process. The CMP stop layer is subsequently removed, leaving the field oxide 114. An example LOCOS process includes forming a silicon nitride mask layer over a layer of LOCOS pad oxide over the substrate 102. The silicon nitride mask layer is removed in areas for the field oxide 114, exposing the LOCOS pad oxide. Silicon dioxide is formed in the areas exposed by the silicon nitride mask layer by thermal oxidation, to form the field oxide 114. The silicon nitride mask layer is subsequently removed, leaving the field oxide 114 in place.

A layer of pad oxide 158 is formed at the top surface 108 of the substrate 102. The pad oxide 158 may be, for example, 5 nanometers to 25 nanometers thick, and may be formed by thermal oxidation or by any of several chemical vapor deposition (CVD) processes. A layer of oxide mask 160 is formed over the layer of pad oxide 158. The layer of oxide mask 160 may include, for example, silicon nitride, formed by a low pressure chemical vapor deposition (LPCVD) process using dichlorosilane and ammonia. Alternatively, silicon nitride in the layer of oxide mask 160 may be formed by decomposition of bis(tertiary-butyl-amino) silane (BT-BAS). Other processes to form the layer of oxide mask 160 are within the scope of the instant example. The layer of oxide mask 160 may be, for example, around 1 to 2 times the thickness of the field relief oxide 122 of FIG. 1.

An etch mask 162 is formed over the layer of oxide mask 160 which exposes an area for the field relief oxide 122 of FIG. 1 in the area for the field-plated FET 110, and exposes an area for implanting the drift region 142 of FIG. 1 in the area for the planar FET 112. The etch mask 162 may include photoresist formed by a photolithographic process, and may include hard mask material such as amorphous carbon, and may include an anti-reflection layer such as an organic bottom anti-reflection coat (BARC). The exposed area for the field relief oxide 122 in the area for the field-plated FET 110 has lateral dimensions that are sufficiently wide so that after etching the layer of oxide mask 160, a central portion of the etched area remains clear after formation of dielectric sidewalls. The exposed area for implanting the drift region 142 in the area for the planar FET 112 has a width sufficiently narrow so that after etching the layer of oxide mask 160, the exposed area for implanting the drift region 142 remains blocked by the dielectric material used to form the dielectric sidewalls.

Figure 2B:
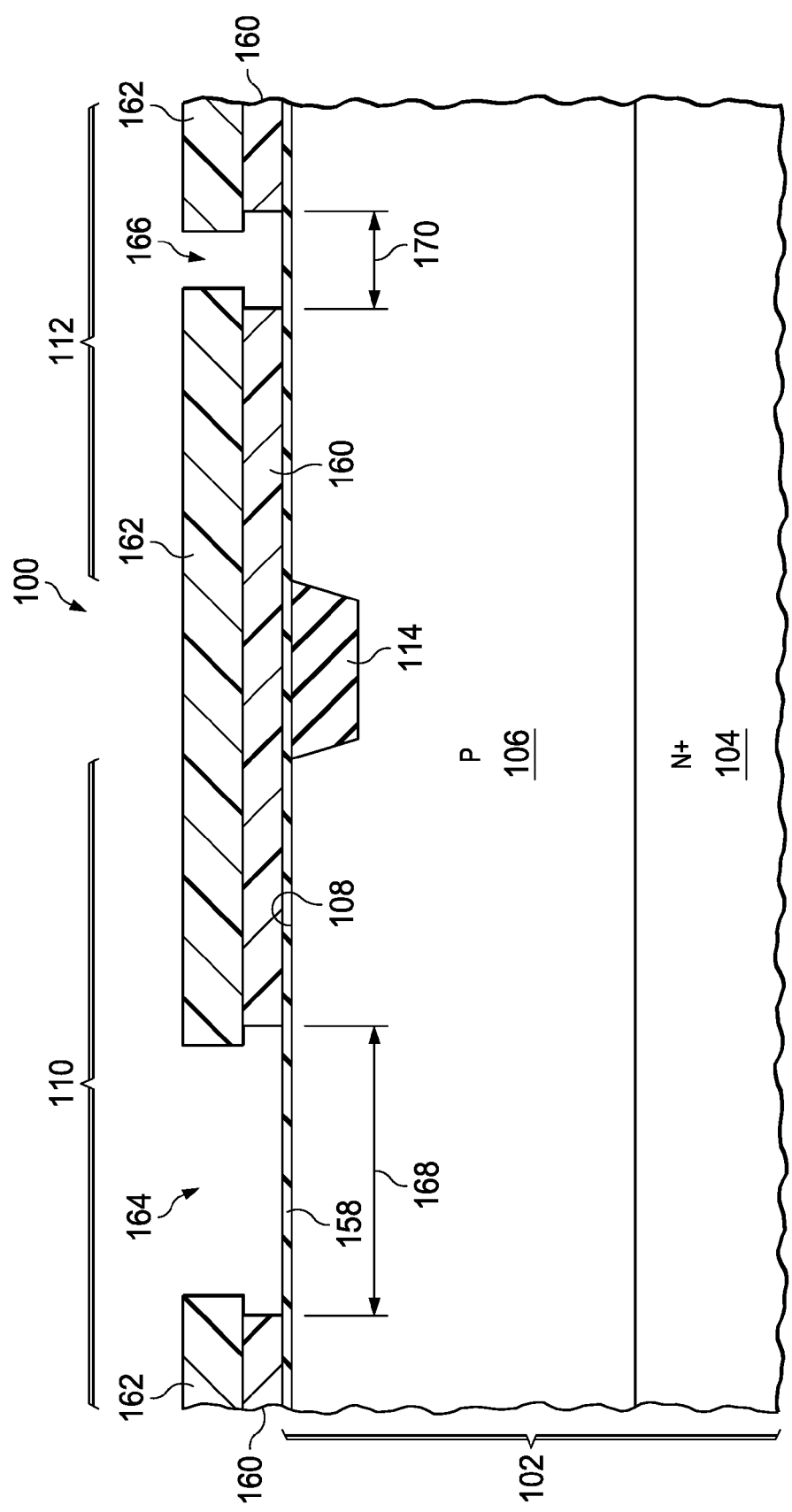

Referring to FIG. 2B, the layer of oxide mask 160 is removed in the areas exposed by the etch mask 162, exposing the layer of pad oxide 158. A portion of the pad oxide 158 may also be removed in the areas exposed by the etch mask 162. Removing the layer of oxide mask 160 in the area for the field-plated FET 110 forms a first opening 164 in the layer of oxide mask 160. Removing the layer of oxide mask 160 in the area for the planar FET 112 forms a second opening 166 in the layer of oxide mask 160. Lateral dimensions 168 of the first opening 164 are sufficiently wide so that a central portion of the first opening 164 remains clear after formation of dielectric sidewalls. For example, in a version of the instant example in which the dielectric sidewalls are formed by deposition of a conformal layer that is 80 nanometers to 100 nanometers thick, the lateral dimensions 168 are greater than about 350 nanometers. A width 170 of the second opening 166 is sufficiently narrow so that the second opening 166 remains blocked by the dielectric material used to form the dielectric sidewalls. To attain a desired amount of dielectric material in the second opening, the width 170 of the second opening 166 may be less than 2.5 times a thickness of a subsequently formed dielectric layer to form dielectric sidewalls in the first opening 164. For example, in the version of the instant example disclosed above in which the dielectric sidewalls are formed by deposition of a conformal layer that is about 80 nanometers thick, the width 170 is less than about 200 nanometers. The layer of oxide mask 160 may be removed by a wet etch, for example an aqueous solution of phosphoric acid, which undercuts the etch mask 162 as depicted in FIG. 2B. Alternatively, the layer of oxide mask 160 may be removed by a plasma etch using fluorine radicals, which may produce less undercut. The etch mask 162 may optionally be removed after etching the layer of oxide mask 160, or may be left in place to provide additional stopping material in a subsequent ion implant step.

Figure 2C:
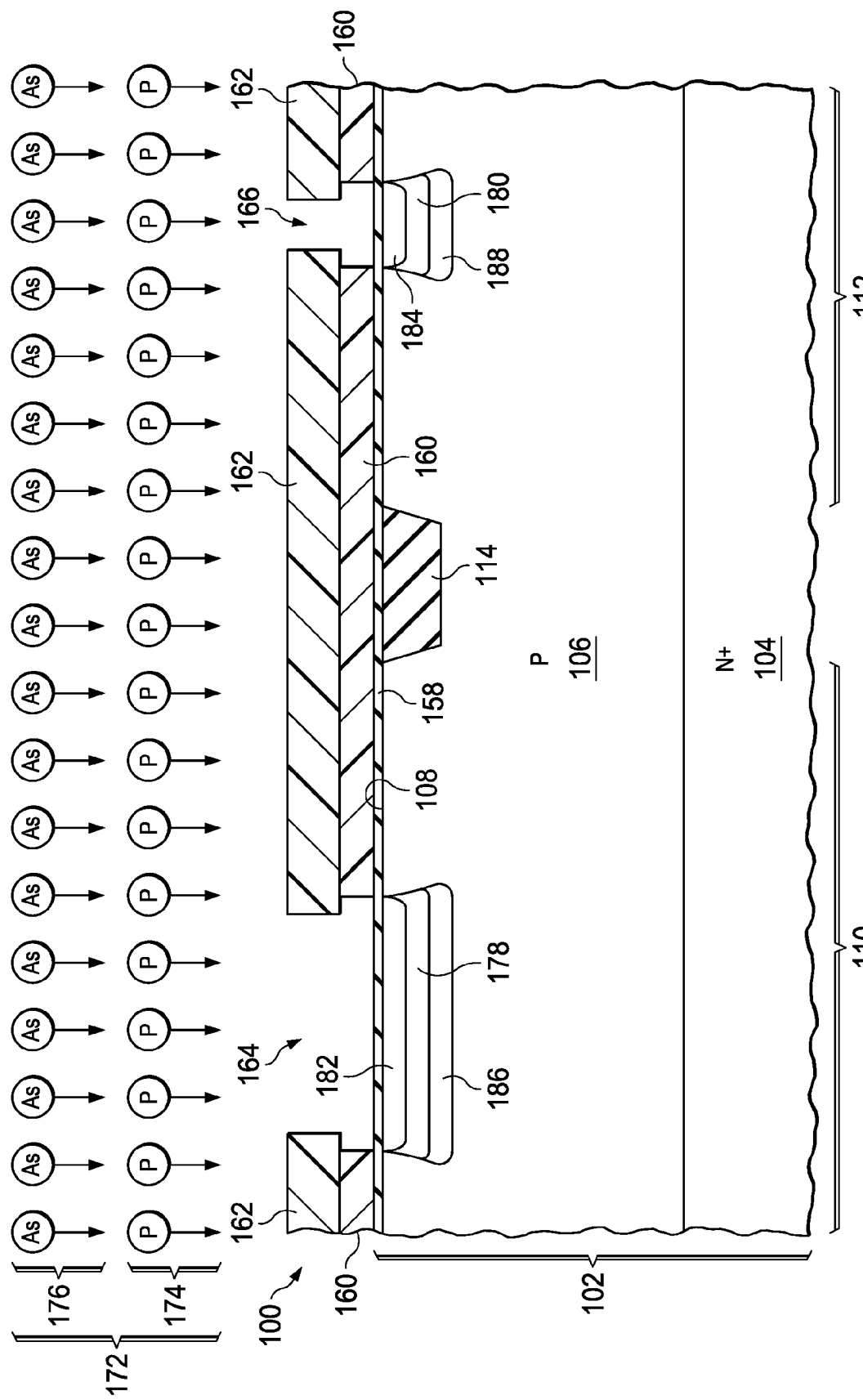

Referring to FIG. 2C, n-type dopants 172 are implanted into the substrate 102 in the areas exposed by removing the layer of oxide mask 160, including the first opening 164 in the area for the field-plated FET 110 and the second opening 166 in the area for the planar FET 112, advantageously self-aligning the subsequently-formed drift region 116 of FIG. 1 to the subsequently-formed field relief oxide 122 of FIG. 1. The n-type dopants 172 may include, for example, phosphorus 174 which may be implanted at a dose of $1 \times 10^{12}$ $cm^{-2}$ to $4 \times 10^{12}$ $cm^{-2}$ at an energy of 150 kilo-electron volts (keV) to 225 keV, and arsenic 176 which may be implanted at a dose of $2 \times 10^{12}$ $cm^{-2}$ to $6 \times 10^{12}$ $cm^{-2}$ at an energy of 100 keV to 150 keV. The implanted phosphorus 174 forms a first phosphorus implanted region 178 under the first opening 164 and a second phosphorus implanted region 180 under the second opening 166. Similarly, the implanted arsenic 176 forms a first arsenic implanted region 182 under the first opening 164 and a second arsenic implanted region 184 under the second opening 166. The first phosphorus implanted region 178 and the second phosphorus implanted region 180 are advantageously deeper than the first arsenic implanted region 182 and the second arsenic implanted region 184, to provide graded junctions in the drift region 116 of FIG. 1 in the field-plated FET 110 and the drift region 142 of FIG. 1 in the planar FET 112. Optionally, the phosphorus dopants 174 of the n-type dopants 172 may also include a deep dose of phosphorus which forms a first deep compensating implanted region 186 in the substrate 102 below the first phosphorus implanted region 178 and forms a second deep compensating implanted region 188 in the substrate 102 below the second phosphorus implanted region 180. The deep dose of phosphorus is intended to compensate the p-type layer 106 so as to reduce the net dopant density without counterdoping the p-type layer 106 to n-type. Any remaining portion of the etch mask 162 is removed after the n-type dopants 172 are implanted.

Figure 2D:
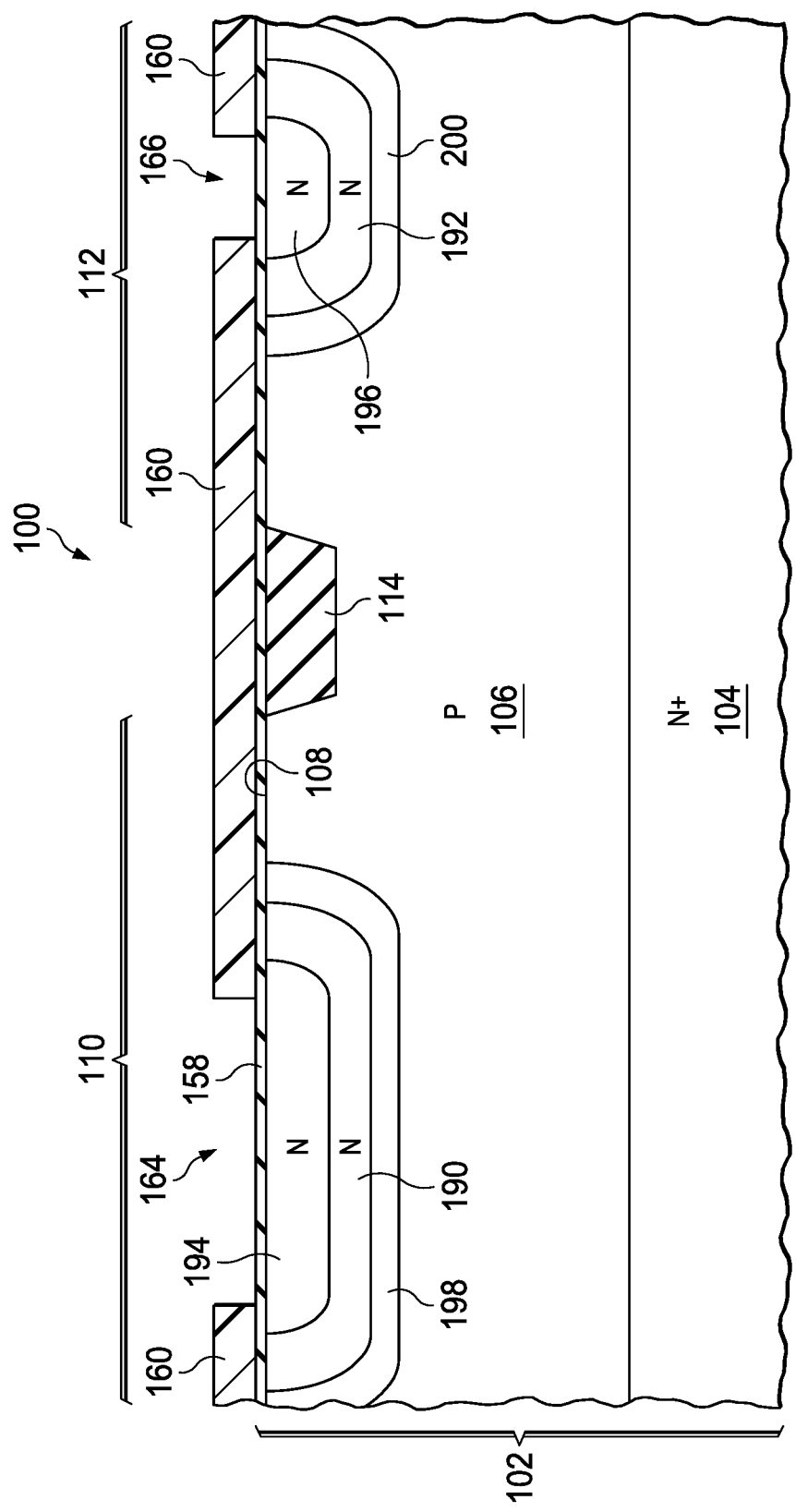

Referring to FIG. 2D, an optional thermal drive operation may be performed which activates and diffuses the implanted n-type dopants 172 of FIG. 2C. For example, the thermal drive operation may include a ramped furnace anneal at about 900° C. to 1050° C. for 30 minutes to 60 minutes. The phosphorus dopants in the first phosphorus implanted region 178 of FIG. 2C form a first phosphorus diffused region 190 under the first opening 164, and the phosphorus dopants in the second phosphorus implanted region 180 of FIG. 2C form a second phosphorus diffused region 192 under the second opening 166. Similarly, the arsenic dopants in the first arsenic implanted region 182 of FIG. 2C form a first arsenic diffused region 194 under the first opening 164, and the arsenic dopants in the second arsenic implanted region 184 of FIG. 2C form a second arsenic diffused region 196 under the second opening 166. The first phosphorus diffused region 190 and the second phosphorus diffused region 192 are advantageously deeper than the first arsenic diffused region 194 and the second arsenic diffused region 196. If the first deep compensating implanted region 186 and the second deep compensating implanted region 188 are formed as described in reference to FIG. 2C, the optional thermal driver operation diffuses and activates the phosphorus dopants in the first deep compensating implanted region 186 of FIG. 2C to form a first compensated region 198 in the substrate 102 under and around the first phosphorus diffused region 190, and diffuses and activates the phosphorus dopants in the second deep compensating implanted region 188 of FIG. 2C to form a second compensated region 200 in the substrate 102 under and around the second phosphorus diffused region 192. In lieu of the optional thermal drive operation, the implanted n-type dopants 172 may be activated and diffused during a subsequent thermal oxidation operation to form the field relief oxide 122 of FIG. 1.

Figure 2E:
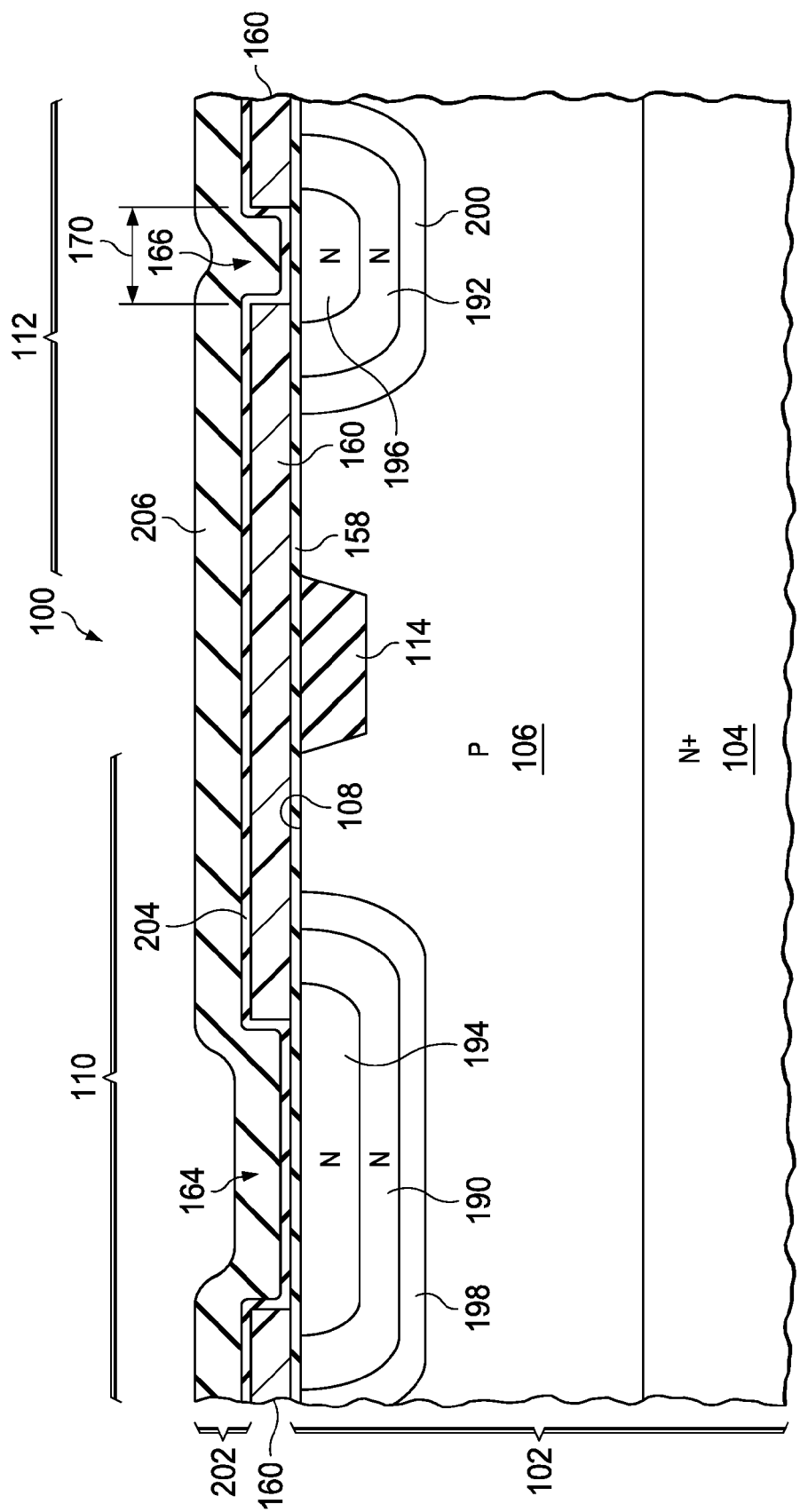

Referring to FIG. 2E, a conformal dielectric layer 202 is formed over the layer of oxide mask 160 and in the first opening 164 in the area for the field-plated FET 110 and in the second opening 166 in the area for the planar FET 112. The conformal dielectric layer 202 may comprise a single layer of dielectric material, or may comprise two or more sub-layers. The conformal dielectric layer 202 may include silicon nitride, silicon dioxide and/or other dielectric material. In the version of the instant example depicted in FIG. 2E, the conformal dielectric layer 202 may include a thin layer of silicon dioxide 204 formed on the layer of oxide mask 160 and on the pad oxide 158, and a layer of silicon nitride 206 formed on the thin layer of silicon dioxide 204. A thickness of the conformal dielectric layer 202 is selected to provide a desired width of subsequently-formed dielectric sidewalls in the first opening 164 on lateral edges of the layer of oxide mask 160, and to block the second opening 166. For example, the thickness of the conformal dielectric layer 202 may be 80 nanometers to 100 nanometers to provide dielectric sidewalls that are 75 nanometers to 90 nanometers wide. The conformal dielectric layer 202 in a center of the second opening 166 is thicker than the conformal dielectric layer 202 in a center of the first opening 164, as a result of the limited width 170 of the second opening 166. Silicon nitride in the conformal dielectric layer 202 may be formed by an LPCVD process or decomposition of BTBAS. Silicon dioxide in the conformal dielectric layer 202 may be formed by decomposition of TEOS.

Figure 2F:
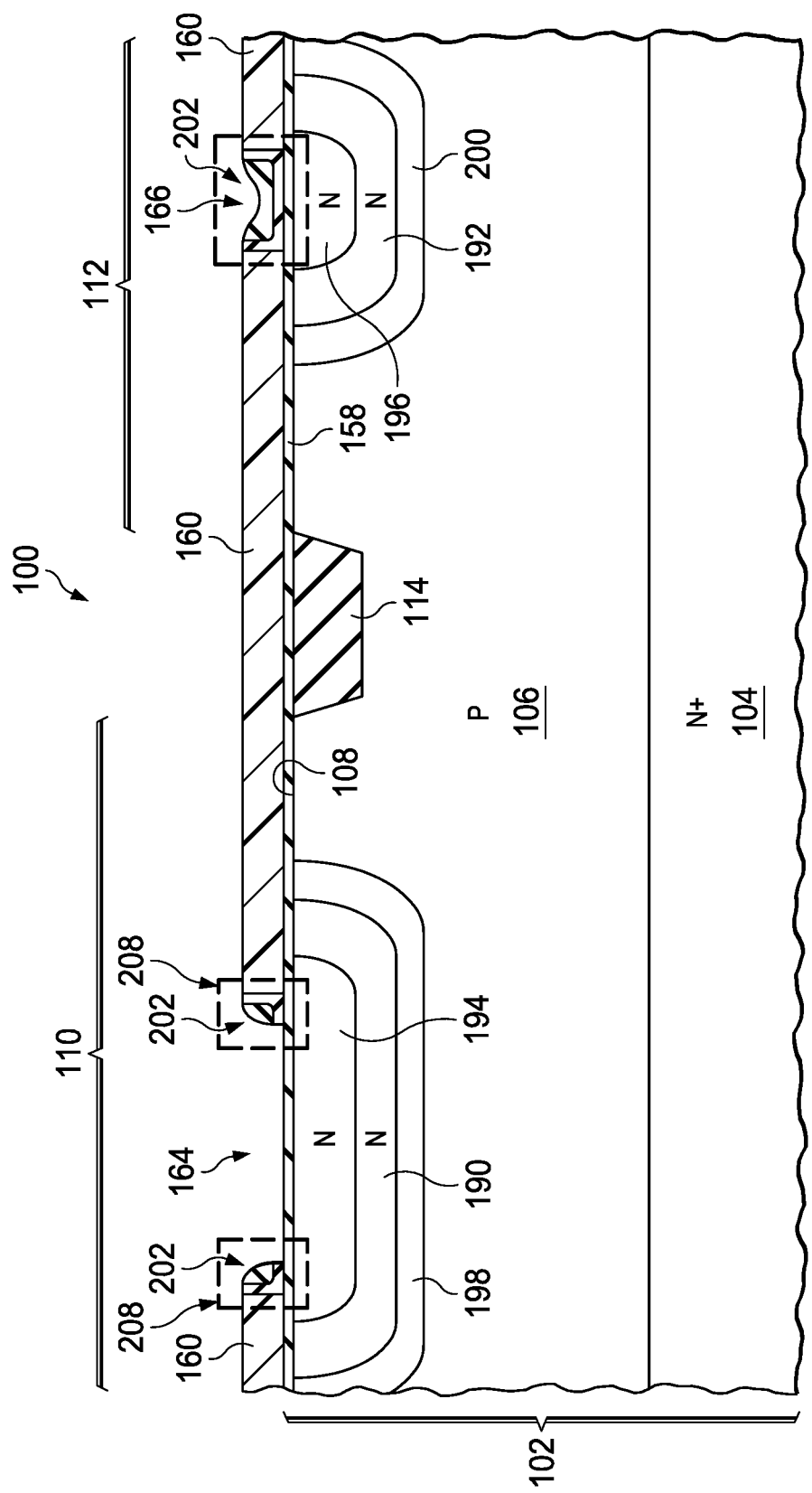

Referring to FIG. 2F, an anisotropic etch process is performed which removes the conformal dielectric layer 202 from a central portion of the first opening 164, leaving dielectric material of the conformal dielectric layer 202 to form dielectric sidewalls 208 in the first opening 164 on lateral edges of the layer of oxide mask 160. A width of the dielectric sidewalls 208 may be, for example, 50 percent to 90 percent of the thickness of the conformal dielectric layer 202 as formed in the center of the first opening 164. The anisotropic etch does not remove all of the dielectric material of the conformal dielectric layer 202 from the second opening 166 so that a continuous portion of the dielectric material covers the pad oxide 158 in the second opening 166.

Figure 2G:
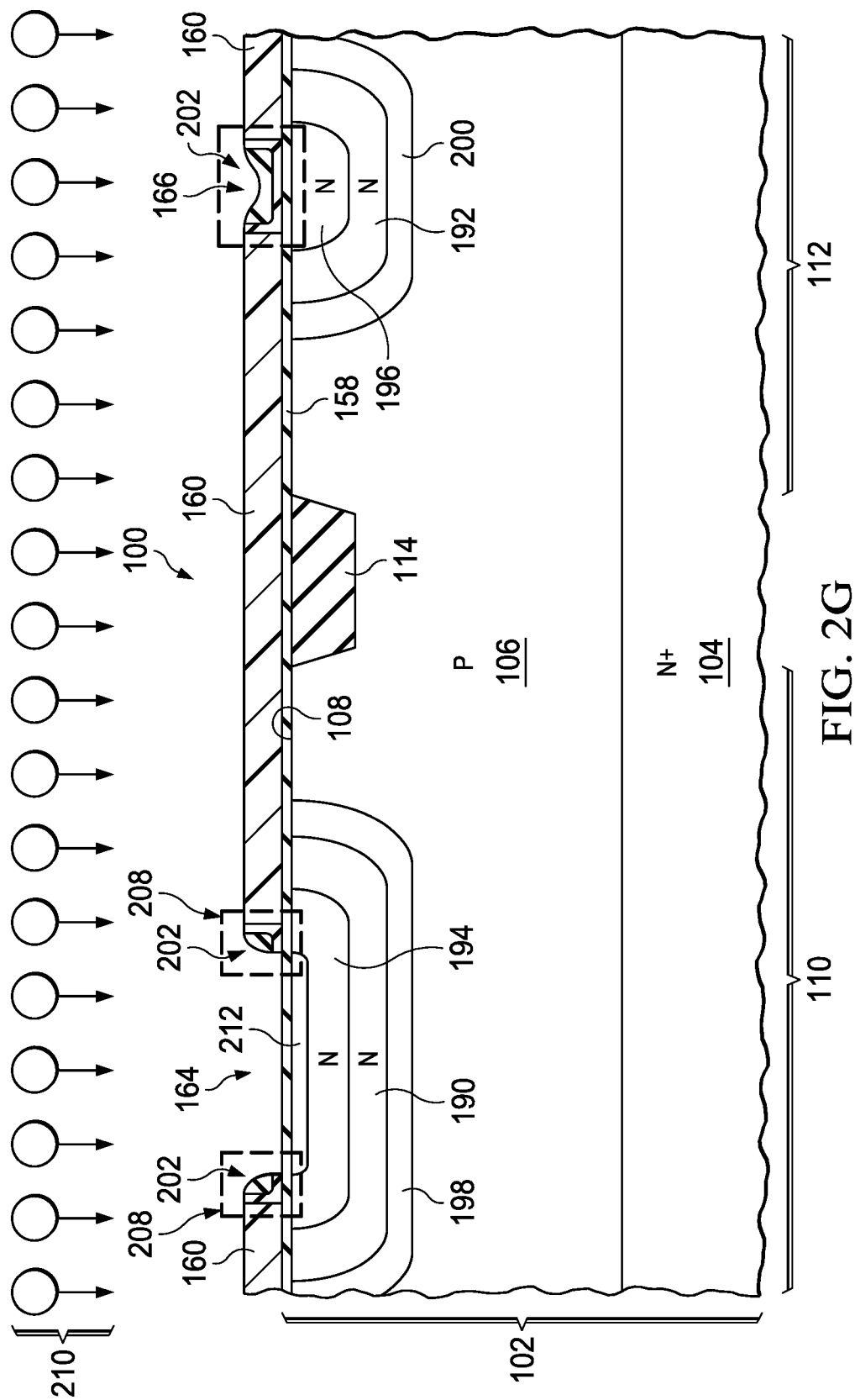

Referring to FIG. 2G, an optional charge adjustment implant operation may be performed which implants charge adjustment dopants 210 are implanted into the substrate 102, using the dielectric sidewalls 208 and the layer of oxide mask 160 as an implant mask. The implanted charge adjustment dopants 210 form a charge adjustment implanted region 212 in the substrate 102 immediately under the first opening 164; lateral extents of the charge adjustment implanted region 212 are defined by the dielectric sidewalls 208, advantageously self-aligning the subsequently-formed charge adjustment region 134 of FIG. 1 to the subsequently-formed field relief oxide 122 of FIG. 1. The dielectric material of the conformal dielectric layer 202 remaining in the second opening 166 blocks the charge adjustment dopants 210 from the substrate 102 below the second opening 166. In one version of the instant example, the charge adjustment dopants 210 may be n-type dopants such as phosphorus and/or arsenic. In another version of the instant example, the charge adjustment dopants 210 may be p-type dopants, such as boron, gallium and/or indium. A dose of the charge adjustment dopants 210 may be, for example, $1 \times 10^{10}$ $cm^{-2}$ to $1 \times 10^{12}$ $cm^{-2}$. The charge adjustment dopants 210 may be implanted at an energy sufficient to place a peak of the implanted dopants 25 nanometers to 100 nanometers into the substrate 102 below the pad oxide 158.

Figure 2H:
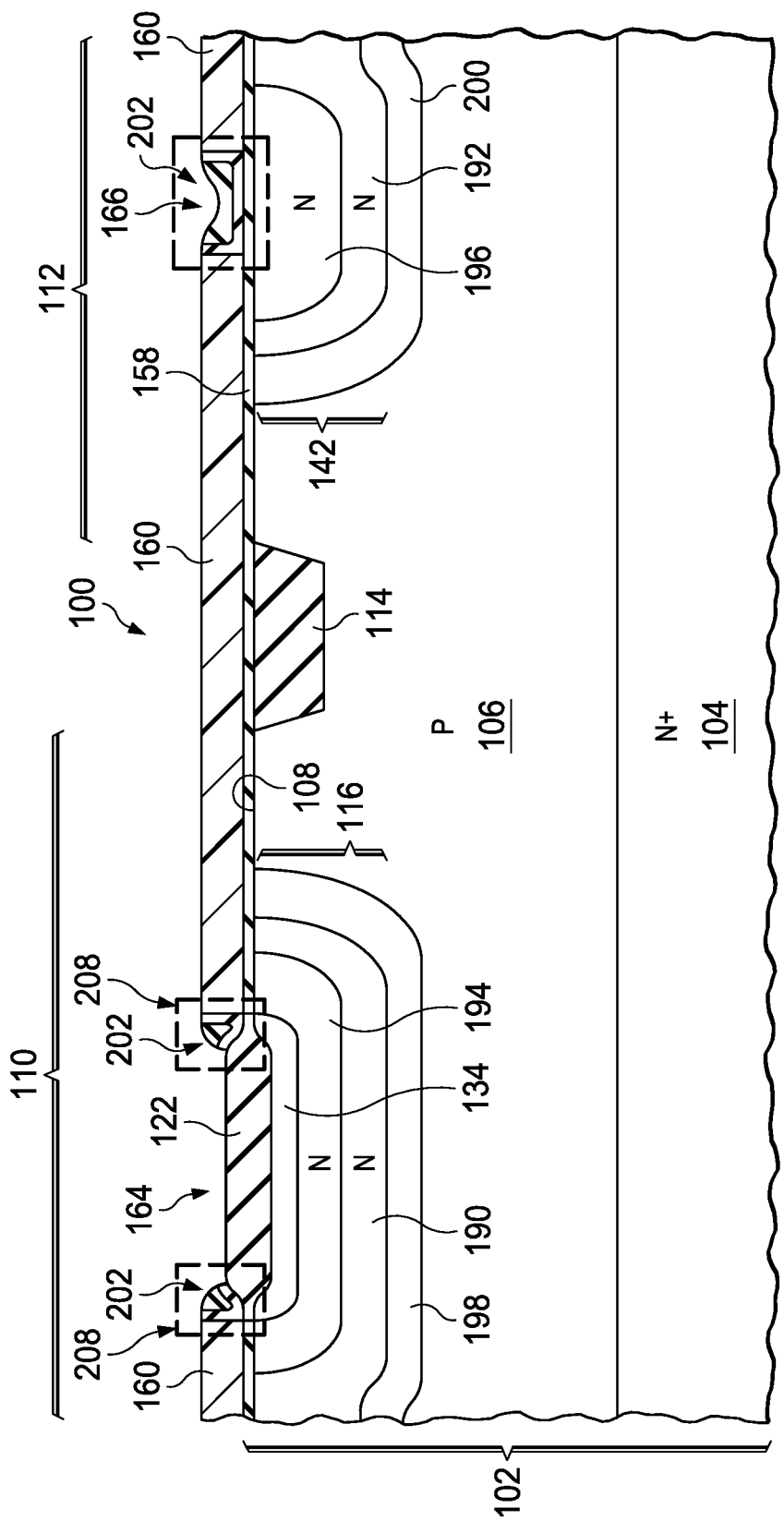

Referring to FIG. 2H, the field relief oxide 122 is formed by thermal oxidation in the first opening 164 in the area for the field-plated FET 110. Properties of the dielectric sidewalls 208 and the layer of oxide mask 160 affect a length and shape of the tapered profile, that is, the bird's beak, at lateral edges of the field relief oxide 122. Thermal oxide does not form in the second opening 166 in the area for the planar FET 112, because the dielectric material of the conformal dielectric layer 202 remaining in the second opening 166 blocks an oxidizing ambient of the thermal oxidation process. An example furnace thermal oxidation process may include ramping a temperature of the furnace to about 1000° C. in a time period of 45 minutes to 90 minutes with an ambient of 2 percent to 10 percent oxygen, maintaining the temperature of the furnace at about 1000° C. for a time period of 10 minutes to 20 minutes while increasing the oxygen in the ambient to 80 percent to 95 percent oxygen, maintaining the temperature of the furnace at about 1000° C. for a time period of 60 minutes to 120 minutes while maintaining the oxygen in the ambient at 80 percent to 95 percent oxygen and adding hydrogen chloride gas to the ambient, maintaining the temperature of the furnace at about 1000° C. for a time period of 30 minutes to 90 minutes while maintaining the oxygen in the ambient at 80 percent to 95 percent oxygen with no hydrogen chloride, and ramping the temperature of the furnace down in a nitrogen ambient. The temperature profile of the thermal oxidation process diffuses and activates the implanted dopants in the charge adjustment implanted region 212 of FIG. 2G to form the charge adjustment region 134. The temperature profile of the thermal oxidation process also further diffuses the n-type dopants of the first phosphorus diffused region 190, the second phosphorus diffused region 192, the first arsenic diffused region 194 and the second arsenic diffused region 196, and the first compensated region 198 and the second compensated region 200, if present. A majority of the n-type dopants in the first arsenic diffused region 194 are arsenic, and a majority of the n-type dopants in the first phosphorus diffused region 190 are phosphorus. Similarly, a majority of the n-type dopants in the second arsenic diffused region 196 are arsenic, and a majority of the n-type dopants in the second phosphorus diffused region 192 are phosphorus. The first phosphorus diffused region 190 and the first arsenic diffused region 194 provide the drift region 116 of the field-plated FET 110.

Similarly, the second phosphorus diffused region 192 and the second arsenic diffused region 196 provide the drift region 142 of the planar FET 112. The first compensated region 198 and the second compensated region 200 are p-type, with a lower net dopant density than the underlying p-type layer 106. The first compensated region 198 and the second compensated region 200 advantageously provide reduced drain junction capacitances for the field-plated FET 110 and the planar FET 112, respectively. The layer of oxide mask 160, the dielectric sidewalls 208 and the dielectric material of the conformal dielectric layer 202 remaining in the second opening 166 are subsequently removed. Silicon nitride may be removed by an aqueous solution of phosphoric acid. Silicon dioxide may be removed by an aqueous solution of buffered dilute hydrofluoric acid.

Figure 2I:
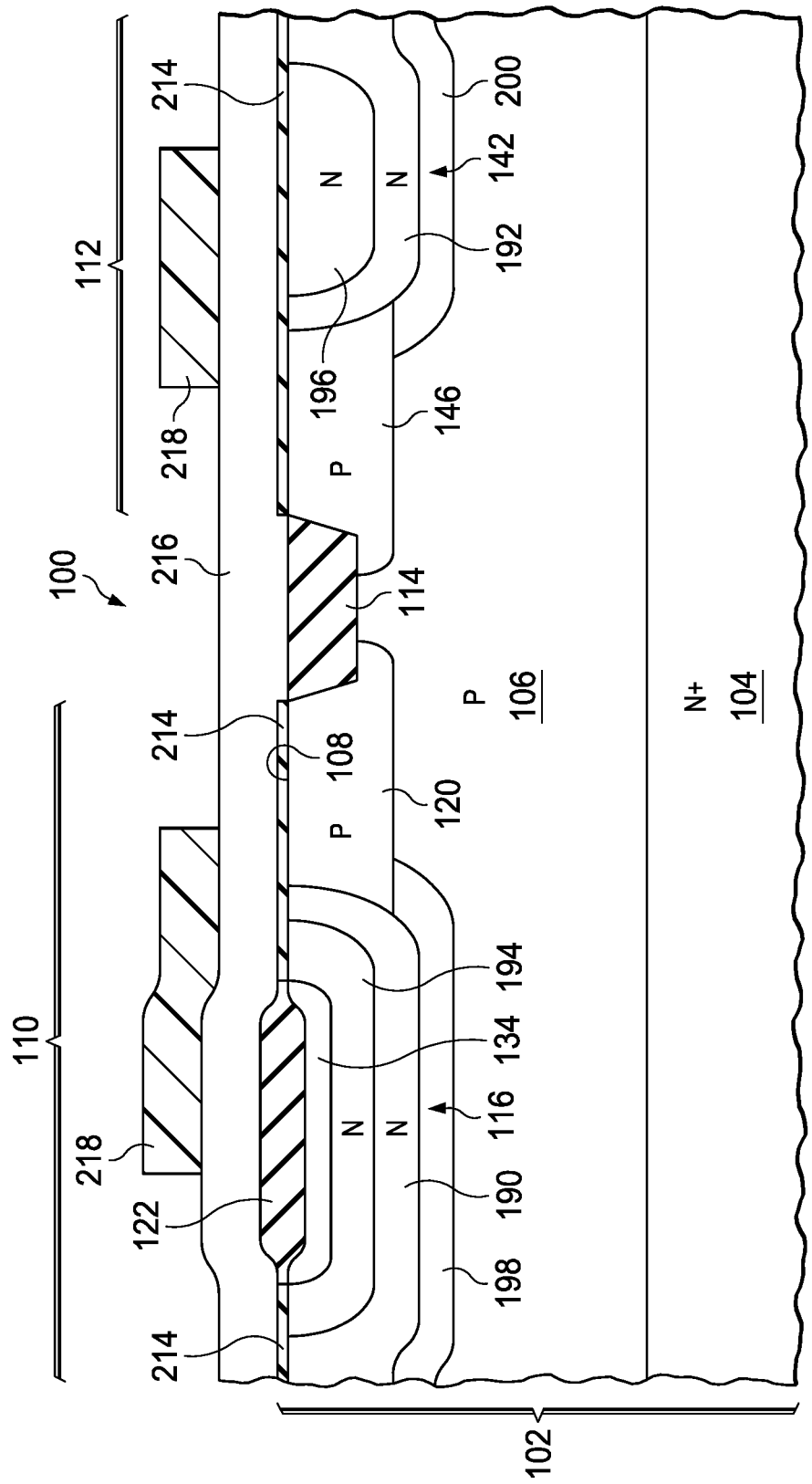

Referring to FIG. 2I, the p-type body 120 of the field-plated FET 110 and the p-type body 146 of the planar FET 112 are formed, possibly concurrently. The body 120 and the body 146 may be formed by implanting p-type dopants such as boron at one or more energies, to provide a desired distribution of the p-type dopants. An example implant operation may include a first implant of boron at a dose of $1 \times 10^{14}$ cm$^{-2}$ to $3 \times 10^{14}$ cm$^{-2}$ at an energy of 80 keV to 150 keV, and a second implant of boron at a dose of $1 \times 10^{13}$ cm$^{-2}$ to $3 \times 10^{13}$ cm$^{-2}$ at an energy of 30 keV to 450 keV. A subsequent anneal process, such as a rapid thermal anneal at 1000° C. for 30 seconds, activates and diffuses the implanted boron.

A layer of gate dielectric material 214 is formed on exposed semiconductor material at the top surface 108 of the substrate 102, including in the areas for the field-plated FET 110 and the planar FET 112. The layer of gate dielectric material 214 may include silicon dioxide, formed by thermal oxidation, and/or hafnium oxide or zirconium oxide, formed by CVD processes, and may include nitrogen atoms introduced by exposure to a nitrogen-containing plasma. A thickness of the layer of gate dielectric material 214 reflects operating voltages of the field-plated FET 110 and the planar FET 112. A layer of gate material 216 is formed over the layer of gate dielectric material 214 and the field relief oxide 122. The layer of gate material 216 may include, for example, polycrystalline silicon, referred to herein as polysilicon, possibly doped with n-type dopants. Other gate materials, such as titanium nitride, in the layer of gate material 216 are within the scope of the instant example. Polysilicon in the layer of gate material 216 may be, for example, 300 nanometers to 800 nanometers thick.

A gate mask 218 is formed over the layer of gate material 216 to cover areas for the gate 130 of FIG. 1 of the field-plated FET 110 and the gate 152 of FIG. 1 of the planar FET 112. In the instant example, the gate mask 218 extends partway over the field relief oxide 122 to cover an area for the field plate 132 of FIG. 1. The gate mask 218 may include photoresist formed by a photolithographic process. The gate mask 218 may also include a layer of hard mask material such as silicon nitride and/or amorphous carbon. Further, the gate mask 218 may include a layer of anti-reflection material, such as a layer of BARC.

Figure 2J:
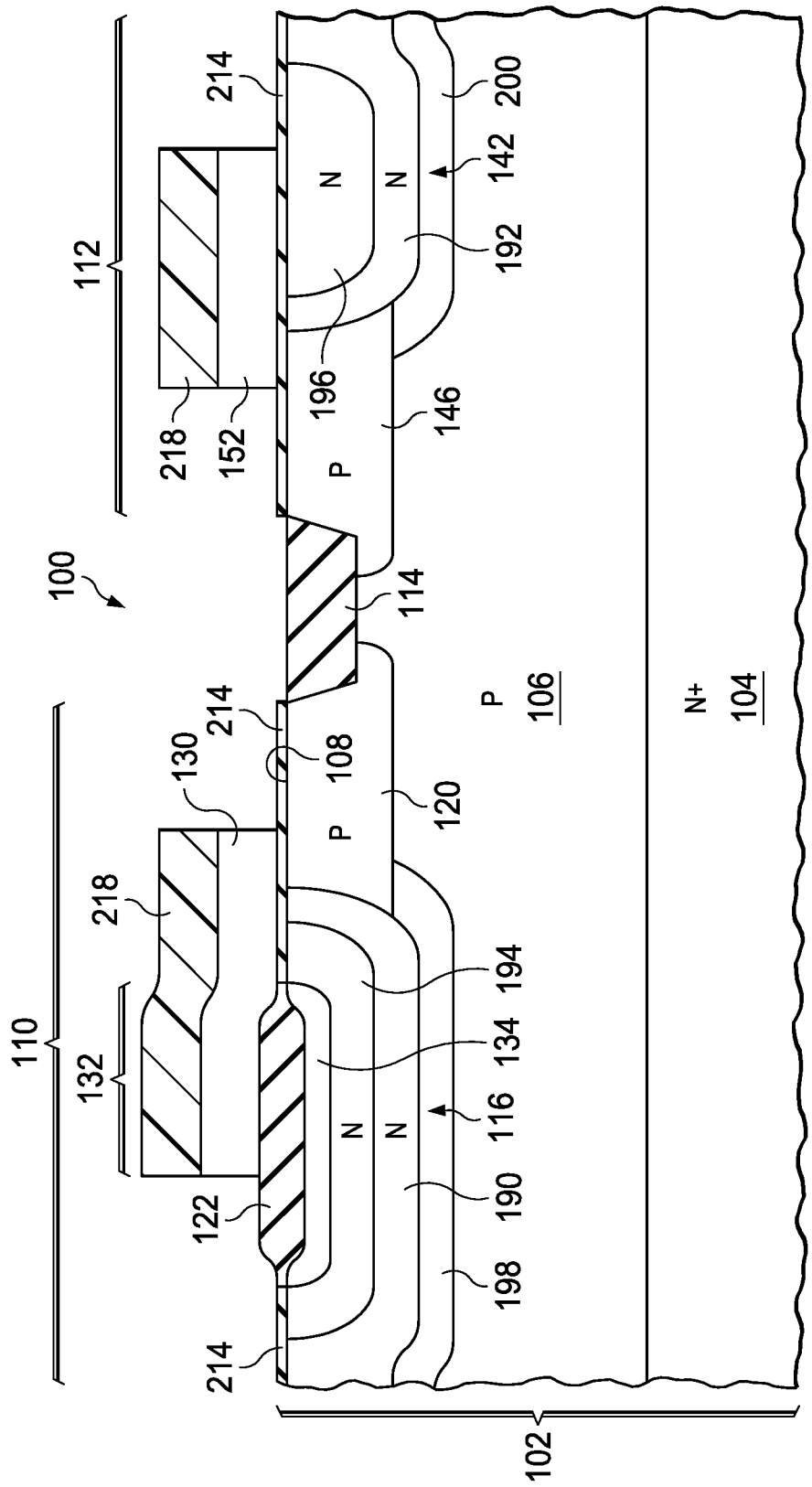

Referring to FIG. 2J, a gate etch process is performed which removes the layer of gate material 216 of FIG. 2I where exposed by the gate mask 218, to form the gate 130 of the field-plated FET 110 and to form the gate 152 of the planar FET 112. The gate etch process may be, for example, a reactive ion etch (ME) process using fluorine radicals. The gate mask 218 may be eroded by the gate etch process. After the gates 130 and 152 are formed, the remaining gate mask 218 is removed.

Figure 2K:
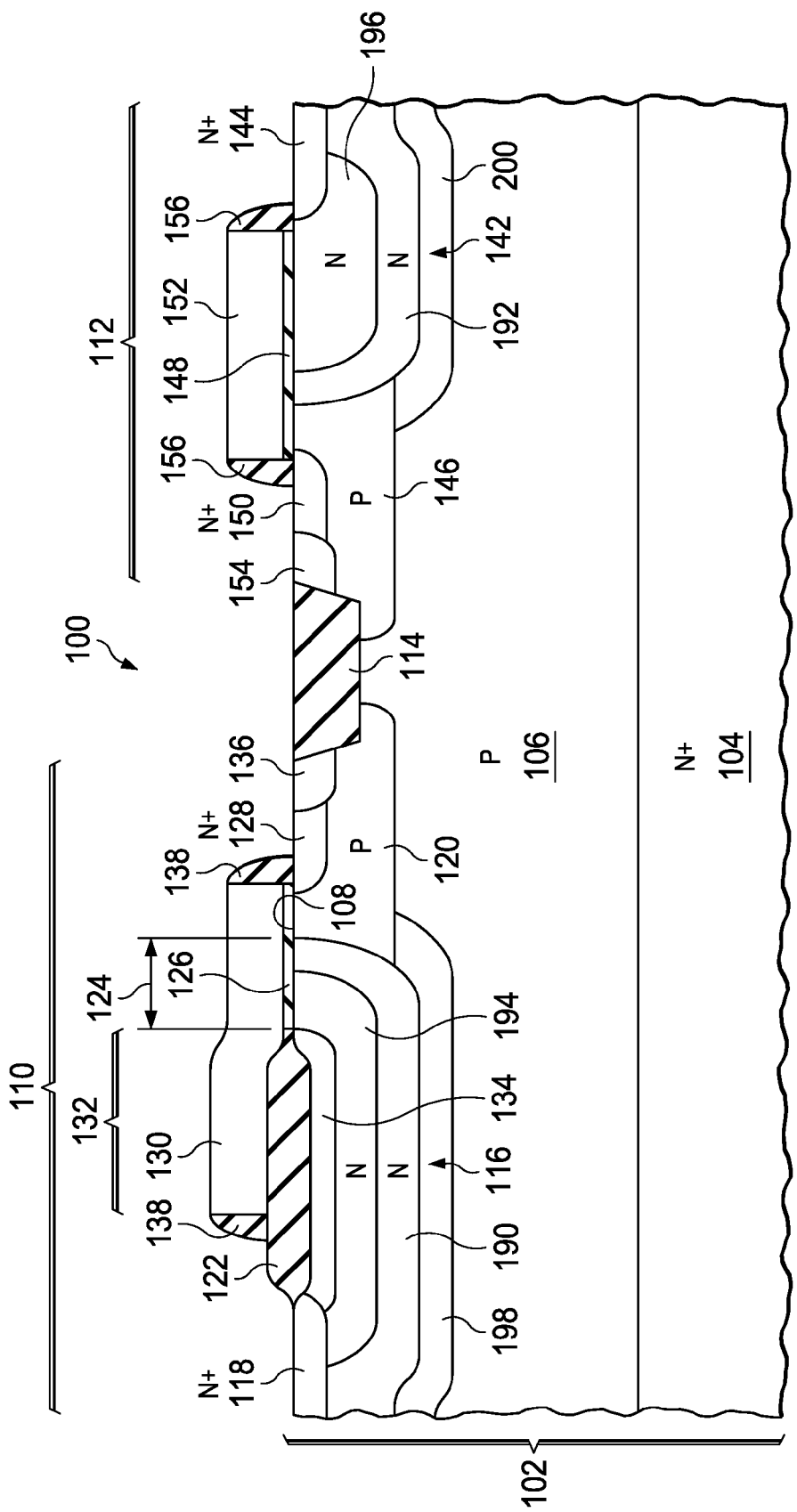

Referring to FIG. 2K, the layer of gate dielectric material 214 of FIG. 2J provides the gate dielectric layer 126 of the field-plated FET 110 and the gate dielectric layer 148 of the planar FET 112. The gate sidewall spacers 138 may be formed on side surfaces of the gate 130 of the field-plated FET 110 by forming a conformal layer of sidewall material, possibly comprising more than one sub-layer of silicon nitride and/or silicon dioxide, over the gate 130 and the top surface 108 of the substrate 102. Subsequently, an anisotropic etch such as an RIE process removes the layer of sidewall material from top surfaces of the gate 130 and the substrate 102, leaving the gate sidewall spacers 138 in place. The gate sidewall spacers 156 on the gate 152 of the planar FET 112 may be formed similarly to, and possibly concurrently with, the gate sidewall spacers 138 of the field-plated FET 110.

The n-type source 128 and n-type drain contact region 118 of the field-plated FET 110 may be formed by implanting n-type dopants such as phosphorus and arsenic, for example at a dose of $1 \times 10^{14}$ cm$^{-2}$ to $5 \times 10^{15}$ cm$^{-2}$ into the substrate 102 adjacent to the gate 130 and the field relief oxide 122, followed by an anneal operation, such as a spike anneal or a flash anneal, to activate the implanted dopants. An n-type drain extension portion of the source 128 which extends partway under the gate 130 may be formed prior to forming the gate sidewall spacers 138 by implanting n-type dopants into the substrate adjacent to the gate 130. The n-type source 150 and n-type drain contact region 144 of the planar FET 112 may be formed similarly to, and possibly concurrently with, the source 128 and drain contact region 118 of the field-plated FET 110.

The p-type body contact region 136 in the body 120 of the field-plated FET 110 may be formed by implanting p-type dopants such as boron, for example at a dose of $1 \times 10^{14}$ cm$^{-2}$ to $5 \times 10^{15}$ cm$^{-2}$ into the substrate 102, followed by an anneal operation, such as a spike anneal or a flash anneal, to activate the implanted dopants. The p-type body contact region 136 in the body 146 of the planar FET 112 may be formed similarly to, and possibly concurrently with, the body contact region 136 in the body 120 of the field-plated FET 110.

Forming the drift region 116 to be self-aligned with the field relief oxide 122 may provide a desired low value of the lateral distance 124 the gate 130 overlaps the drift region 116, advantageously providing a low gate-drain capacitance. Further, the self-aligned configuration may provide the lateral distance 124 to be controllable from device to device without undesired variability due to unavoidable photolithographic alignment variations, sometimes referred to as alignment errors.

Figure 3A:
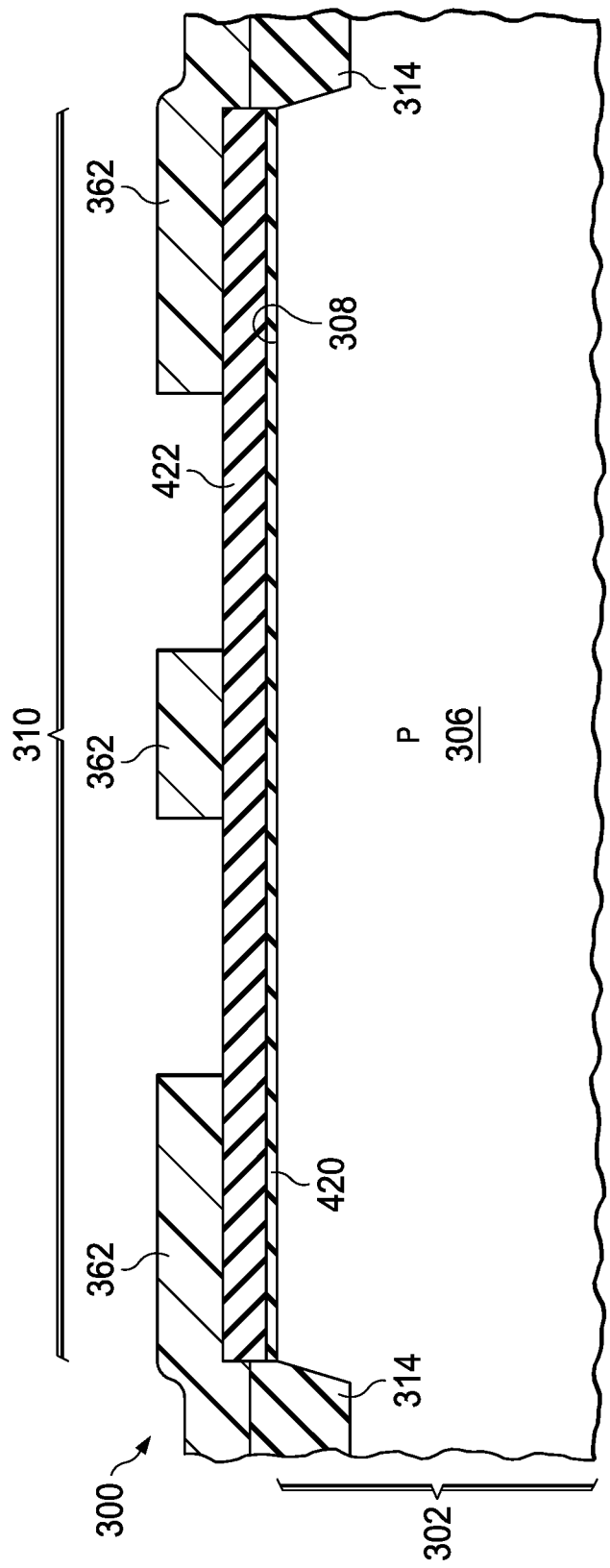
FIG. 3A through FIG. 3F are cross sections of another example integrated circuit containing a field-plated FET, depicted in successive stages of an example method of formation.

FIG. 3A through FIG. 3F are cross sections of another example integrated circuit containing a field-plated FET, depicted in successive stages of an example method of formation. In the instant example, an n-channel field-plated FET will be disclosed. An analogous p-channel field-plated FET may be described with appropriate changes in polarities of dopants. Referring to FIG. 3A, the integrated circuit 300 includes a substrate 302 with a p-type layer 306 extending to a top surface 308 of the substrate 302. The p-type layer 306 may be an epitaxial layer on a semiconductor wafer, or may be a top portion of a bulk silicon wafer. The integrated circuit 300 includes the n-channel field-plated FET 310, which in the instant example has a symmetric drain-centered configuration. The integrated circuit 300 may also optionally include a planar FET, not shown in FIG. 3A through FIG. 3F. In the instant example, the integrated circuit 300 includes field oxide 314 around an area for the field-plated FET 310. The field oxide 314 is formed by an STI process, as described in reference to FIG. 2A. The STI process uses a layer of STI pad oxide 420 over the top surface 308 of the substrate 302, and a CMP stop layer 422 of silicon nitride over the layer of STI pad oxide 420. In the instant example, the layer of STI pad oxide 420 and the CMP stop layer 422 are not removed after forming the field oxide 314, and are used to form the field-plated FET 310.

The layer of STI pad oxide 420 and the CMP stop layer 422 extend across the area for the field-plated FET 310. An etch mask 362 is formed over the CMP stop layer 422 which exposes areas for a subsequently-formed field relief oxide in the area for the field-plated FET 310. The etch mask 362 may be formed as described in reference to FIG. 2A. The exposed areas for the field relief oxide have lateral dimensions that are sufficiently wide so that after etching the CMP stop layer 422, central portions of the etched areas remains clear after formation of dielectric sidewalls.

Figure 3B:
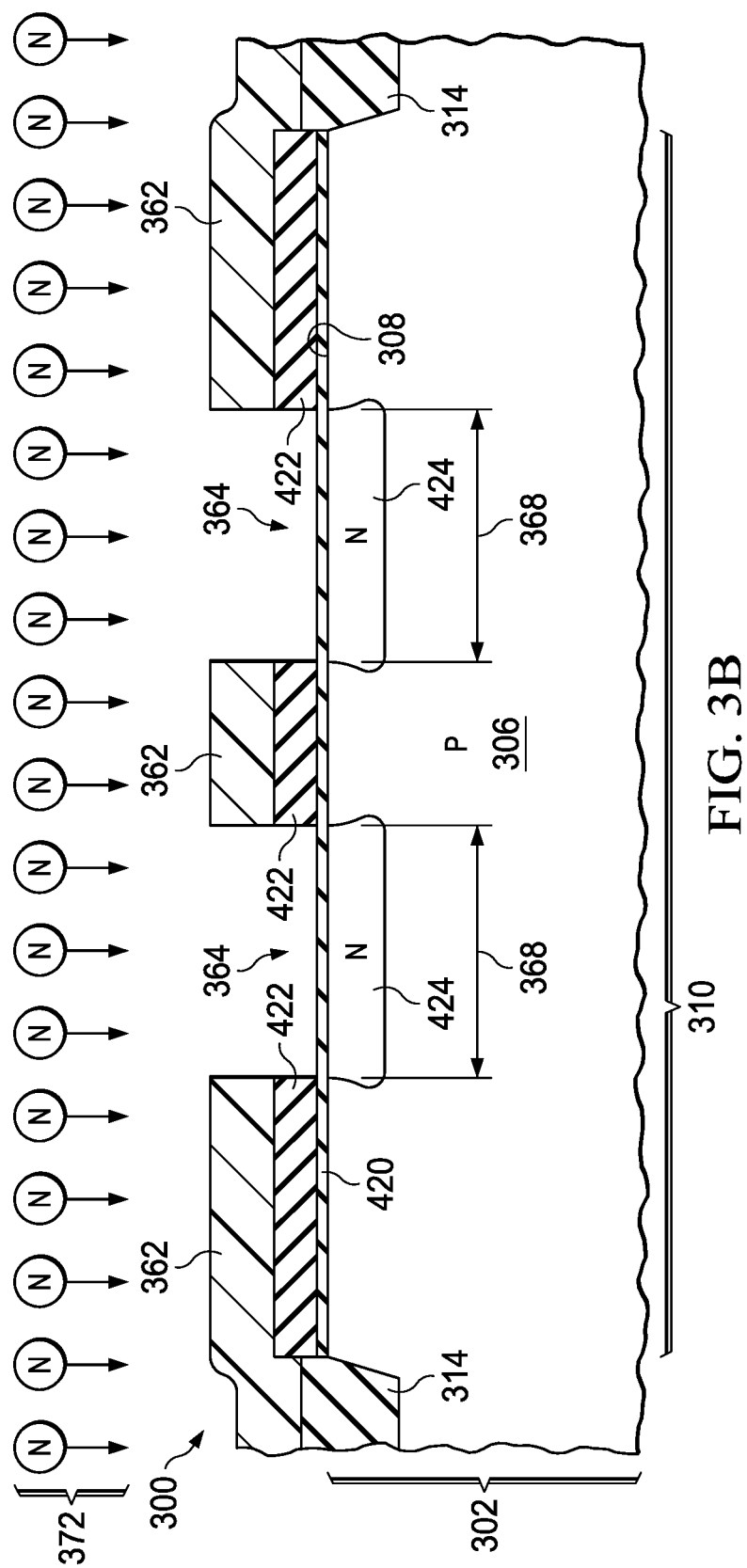

Referring to FIG. 3B, the CMP stop layer 422 is removed in the areas exposed by the etch mask 362, exposing the layer of STI pad oxide 420, forming openings 364 in the CMP stop layer 422. Lateral dimensions 368 of the openings 364 are sufficiently wide so that central portions of the openings 364 remain clear after formation of dielectric sidewalls. The CMP stop layer 422 may be removed by a plasma etch using fluorine radicals, which may produce very little undercut, as depicted in FIG. 3B. Alternatively, the CMP stop layer 422 may be removed by a wet etch, as described in reference to FIG. 2B.

N-type dopants 372 are implanted into the substrate 302 in the areas exposed by removing the CMP stop layer 422, including the openings 364 in the area for the field-plated FET 310, advantageously self-aligning a subsequently-formed drift region to the subsequently-formed field relief oxide. The n-type dopants 372 may include, for example, phosphorus and arsenic as described in reference to FIG. 2C. The implanted n-type dopants 372 form drift implanted regions 424 under the openings 364. Any remaining portion of the etch mask 362 is removed after the n-type dopants 372 are implanted.

Figure 3C:
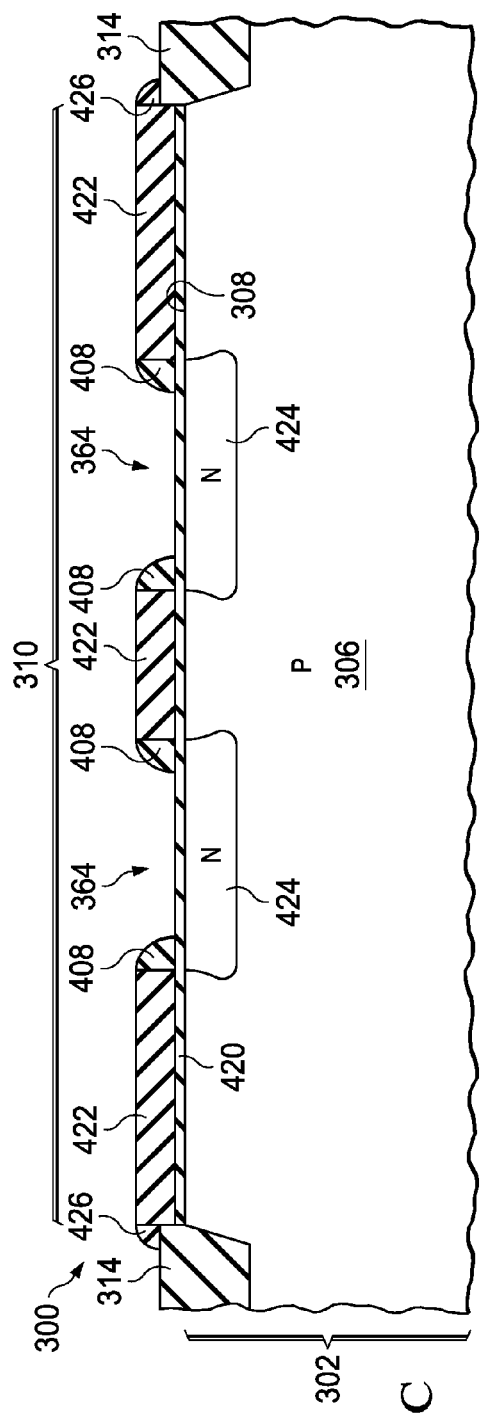

Referring to FIG. 3C, dielectric sidewalls 408 are formed in the openings 364 on lateral edges of the CMP stop layer 422, for example as described in reference to FIG. 2E and FIG. 2F. Additional sidewalls 426 may be formed over the field oxide 314 on lateral edges of the CMP stop layer 422, concurrently with the dielectric sidewalls 408 in the openings 364. Central portions of the openings 364 are clear after forming the dielectric sidewalls 408.

Figure 3D:
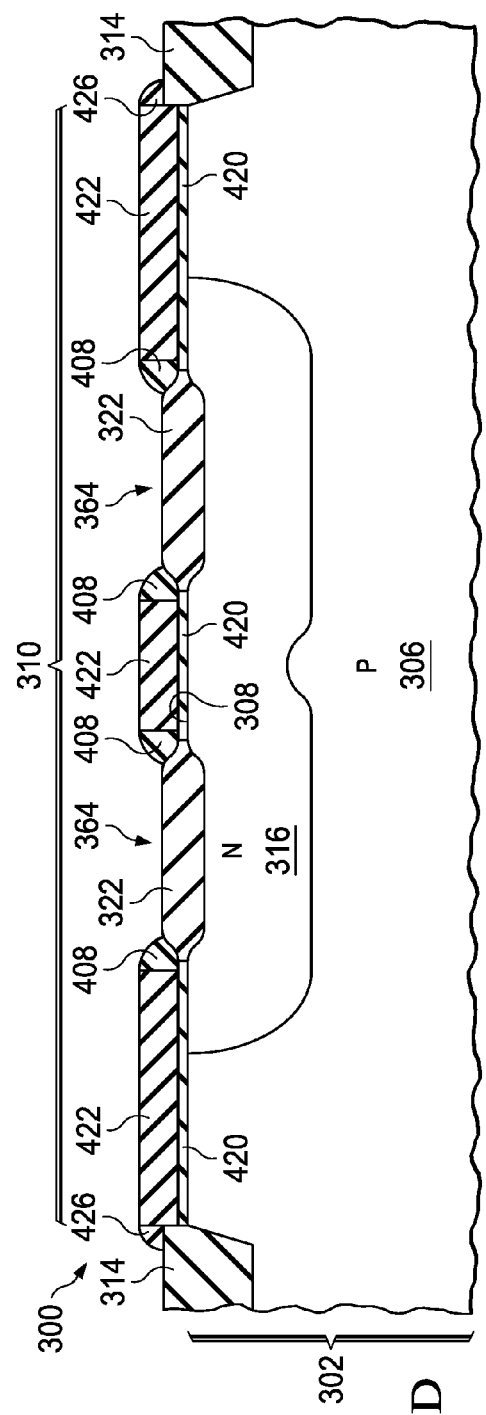

Referring to FIG. 3D, the field relief oxide 322 is formed by thermal oxidation in the openings 364 in the area for the field-plated FET 310. Properties of the dielectric sidewalls 408 and the CMP stop layer 422 affect a length and shape of lateral edges of the field relief oxide 322. The field relief oxide 322 may be formed by a furnace thermal oxidation process as described in reference to FIG. 2H. The temperature profile of the thermal oxidation process diffuses and activates the implanted n-type dopants in the drift implanted region 424 of FIG. 3C to form a drift region 316 of the field-plated FET 310. The CMP stop layer 422, the dielectric sidewalls 408 and the additional sidewalls 426 are subsequently removed.

Figure 3E:
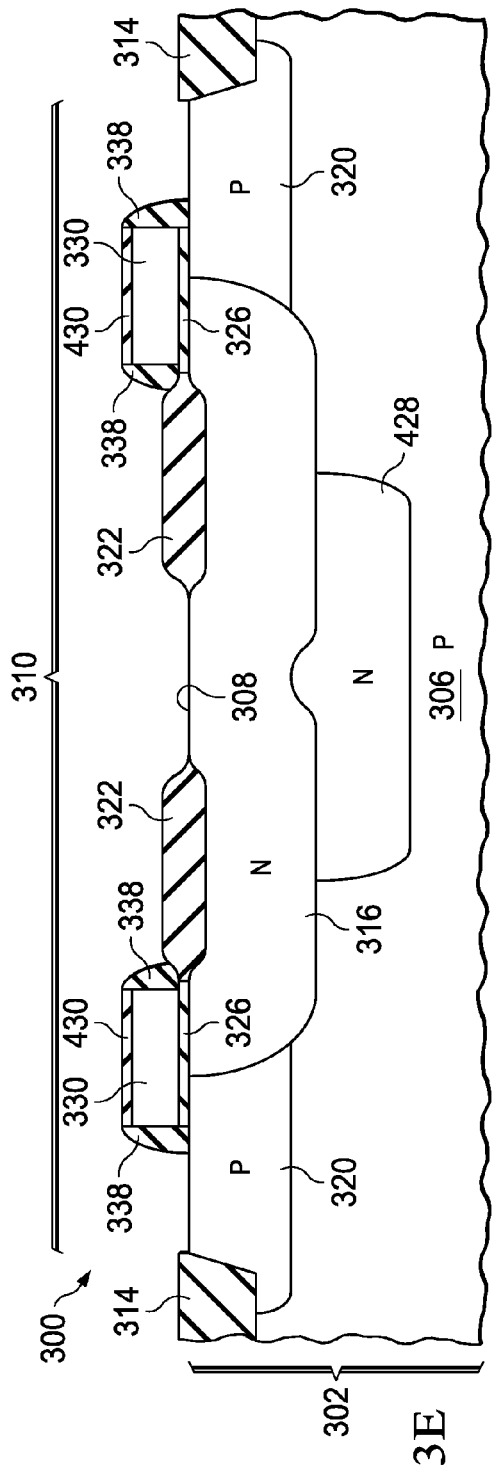

Referring to FIG. 3E, an n-type well 428 may optionally be formed in the substrate 302 under the drift region 316 centrally located with respect to the field relief oxide 322. The n-type well 428 may advantageously reduce a drain resistance of the field-plated FET 310 and spread current flow through a central portion of the drain of the field-plated FET 310, providing improved reliability. The n-type well 428 may be formed concurrently with other n-type wells under p-channel metal oxide semiconductor (PMOS) transistors in logic circuits of the integrated circuit 300. A p-type body 320 of the field-plated FET 310 is formed in the substrate 302 abutting the drift region 316. The body 320 may be formed by implanting p-type dopants such as boron, for example as described in reference to FIG. 2I. A subsequent anneal process activates and diffuses the implanted boron.

The layer of STI pad oxide 420 of FIG. 3D is removed. A gate dielectric layer 326 is formed at the top surface 308 of the substrate 302 adjacent to the field relief oxide 322. The gate dielectric layer 326 may be formed, for example, as described in reference to FIG. 2I. A gate 330 of the field-plated FET 310 is formed over the gate dielectric layer 326, extending from proximate the field relief oxide 322 to partway overlapping the body 320. The gate 330 extends over a portion of the drift region between the field relief oxide 322 and the body 320. The gate 330 may be formed as described in reference to FIG. 2I and FIG. 2J.

Gate sidewall spacers 338 are formed on side surfaces of the gate 330, for example as described in reference to FIG. 2K. In the instant example, a gate cap 430 of dielectric material is formed over a top surface of the gate 330. The gate cap 430 and the gate sidewall spacers 338 electrically isolate the top surface and lateral surfaces of the gate 330. The gate cap 430 may be formed, for example, by forming a dielectric layer over a layer of gate material prior to forming a gate mask and performing a gate etch.

Figure 3F:
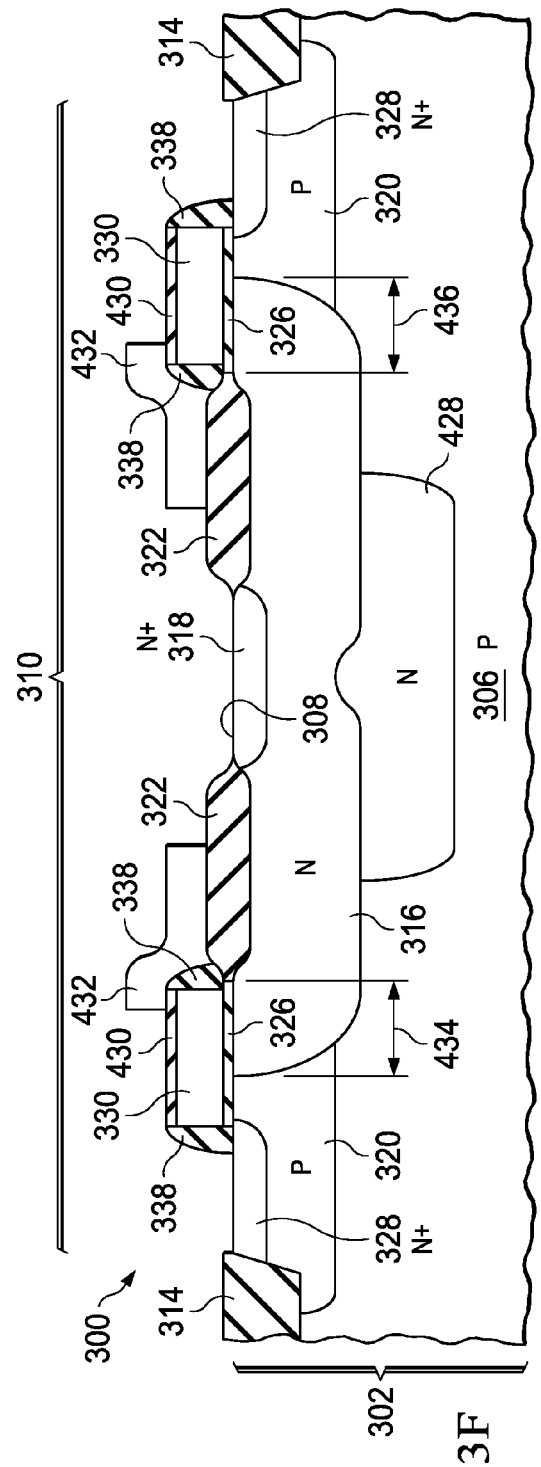

Referring to FIG. 3F, an n-type drain contact region 318 is formed in the substrate 302 in the drift region 316 between two opposing portions of the field relief oxide 322. An n-type source 328 is formed in the substrate 302 adjacent to the gate 330 opposite from the drain contact region 318. The drain contact region 318 and the source 328 may be formed as described in reference to FIG. 2K, and may be formed concurrently. An n-type drain extension portion of the source 328 which extends partway under the gate 330 may be formed prior to forming the gate sidewall spacers 338.

In the instant example, a field plate 432 is formed immediately over a portion of the field relief oxide 322, extending to the gate 330. The field plate 432 is electrically isolated from the gate 330. The field plate 432 may be formed by forming a layer of conductive material, such as polysilicon or titanium nitride, over the gate 330 and field relief oxide 322, forming an etch mask over the layer of conductive material to cover an area for the field plate 432, and performing an etch process to define the field plate 432. The integrated circuit 300 may be configured to apply separate bias voltages to the gate 330 and the field plate 432. Forming the field plate 432 to be electrically isolated and separately biasable from the gate 330 may advantageously enable reduction of an electric field in the drift region 316 during operation of the field-plated FET 310 compared to an analogous field-plated FET with a gate overlapping field relief oxide to provide a field plate.

The drift region 316 extends past the field relief oxide 322 a first lateral distance 434 on a first side of the field-plated FET 310, and extends past the field relief oxide 322 a second lateral distance 436 on a second side opposite from the first side. As a result of the drift region 316 being formed in a self-aligned manner with the field relief oxide 322, the first lateral distance 434 is substantially equal to the second lateral distance 436, which may advantageously provide for uniform current distribution through the field-plated FET 310. Forming the drift region 316 to be self-aligned with the field relief oxide 322 may also advantageously provide a desired narrow range of values for the first lateral distance 434 and the second lateral distance 436 which is controllable from device to device without undesired variability due to unavoidable photolithographic alignment variations, sometimes referred to as alignment errors.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A device, comprising:
a semiconductor substrate having a surface and including a semiconductor layer having a first conductivity type;
a dielectric layer along the surface of the semiconductor substrate;
an oxide layer along the surface of the semiconductor substrate, the oxide layer having a tapered edge laterally connected to the dielectric layer;
a conductive plate above and across the oxide layer and the dielectric layer;
a first doped region within the semiconductor layer and having a second conductivity type opposite the first conductivity type, the first doped region extending under and across the oxide layer and the dielectric layer;
a second doped region having the first conductivity type, the second doped region interfacing the first doped region under the dielectric layer; and
a third doped region between the first doped region and the semiconductor layer, the third doped region having the first conductivity type and including a dopant of the second conductivity type,
wherein the first doped region includes a first sub-region doped with a first dopant species, and includes a second sub-region doped with a second different dopant species.

2. The device of claim 1, wherein the oxide layer has a thickness at least twice that of the dielectric layer.

3. The device of claim 1, wherein the oxide layer is a first oxide layer and further comprising a second oxide layer that abuts the second doped region and extends below the surface of the semiconductor substrate by a greater depth than does the first oxide layer.

4. The device of claim 1, wherein the oxide layer is a first oxide layer and further comprising a second oxide layer that abuts the second doped region, wherein the first-oxide layer extends above the surface of the semiconductor substrate by a greater height than does the second oxide layer.

5. The device of claim 1, wherein the oxide layer is a first oxide layer and further comprising a second oxide layer that abuts the second doped region, wherein the first-oxide layer is thinner than the second oxide layer.

6. The device of claim 1, wherein the conductive plate includes a field plate above the oxide layer, and a gate structure above the dielectric layer and connected to the field plate.

7. The device of claim 1, wherein the first conductivity type is p-type, and the second conductivity type is n-type.

8. The device of claim 1, further comprising a fourth doped region between the first doped region and the oxide layer, the fourth doped region having a different dopant concentration than the first doped region.

9. The device of claim 8, wherein the fourth doped region has the second conductivity type.

10. The device of claim 9, wherein the fourth doped region and the first doped region are both doped with a dopant of the second conductivity type, and the fourth doped region is additionally doped with a dopant of the first conductivity type.

11. The device of claim 8, wherein the fourth doped region is doped with a first concentration of a dopant of the second conductivity type, and is doped with a second greater concentration of a dopant of the first conductivity type.

12. The device of claim 1, wherein a portion of the third doped region is located between the second doped region and the semiconductor layer.

13. A device, comprising:
a semiconductor substrate having a surface;
a dielectric layer along the surface of the semiconductor substrate;
an oxide layer along the surface of the semiconductor substrate, the oxide layer having a tapered edge laterally connected to the dielectric layer;
a gate structure located over the dielectric layer;
a field plate located over the oxide layer;
a first doped region having a first conductivity type and extending under and across the oxide layer and the dielectric layer, the first doped region including a first sub-region doped with a first dopant species and including a second sub-region doped with a second different dopant species, the first sub-region located between the second sub-region and the oxide layer; and
a second doped region having a second conductivity type opposite of the first conductivity type, the second doped region and the first doped region having an interface that intersects the substrate surface under the dielectric layer,
wherein the first doped region is doped with a first-type dopant and has the first conductivity type, and a third doped region located between the oxide layer and the first doped region is doped with the first-type dopant and a second-type dopant and has the first conductivity type.

14. The device of claim 13, wherein the oxide layer is a first oxide layer, and further comprising a second oxide layer that abuts the second doped region and the second oxide layer extends below the surface of the semiconductor substrate by a greater depth than the first oxide layer.

15. The device of claim 13, wherein the oxide layer is a first oxide layer, and further comprising a second oxide layer that abuts the second doped region and the first oxide layer is thinner than the second oxide layer.

16. The device of claim 13, further comprising a fourth doped region abutting the first doped region, the fourth doped region having the second conductivity type and including a dopant species of the first conductivity type.

17. The device of claim 13, further comprising a third doped region between the first doped region and the oxide layer, the third doped region having a different dopant concentration than the first doped region.

18. The device of claim 13, wherein the gate structure is insulated from the field plate.

19. The device of claim 13, wherein the first conductivity type is n-type, and the second conductivity type is p-type.

20. A device, comprising:
a semiconductor substrate having a surface and including a semiconductor layer having a first conductivity type;

a dielectric layer along the surface of the semiconductor substrate;

an oxide layer along the surface of the semiconductor substrate, the oxide layer having a tapered edge laterally connected to the dielectric layer;

a conductive plate above and across the oxide layer and the dielectric layer;

a first doped region within the semiconductor layer and having a second conductivity type opposite the first conductivity type, the first doped region extending under and across the oxide layer and the dielectric layer;

a second doped region having the first conductivity type, the second doped region interfacing the first doped region under the dielectric layer;

a third doped region between the first doped region and the semiconductor layer, the third doped region having the first conductivity type and including a dopant of the second conductivity type; and a fourth doped region between the first doped region and the oxide layer, the fourth doped region having a different dopant concentration than the first doped region, wherein the fourth doped region is doped with a first concentration of a dopant of the second conductivity type, and is doped with a second greater concentration of a dopant of the first conductivity type.

\* \* \* \* \*